(12) United States Patent
Wada

(10) Patent No.: US 6,232,902 B1
(45) Date of Patent: May 15, 2001

(54) SIGMA-DELTA ANALOG-TO-DIGITAL CONVERTER

(75) Inventor: Masami Wada, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 09/396,930

(22) Filed: Sep. 15, 1999

(30) Foreign Application Priority Data

Sep. 22, 1998 (JP) .................................. 10-268129
Feb. 18, 1999 (JP) .................................. 11-039618
Mar. 16, 1999 (JP) .................................. 11-069893

(51) Int. Cl.$^7$ ..................................................... H03M 3/00
(52) U.S. Cl. ............................................. 341/143; 341/155
(58) Field of Search .................................. 341/143, 155, 341/110, 144

(56) References Cited

U.S. PATENT DOCUMENTS

| | | | | |
|---|---|---|---|---|
| 3,896,399 | * | 7/1975 | McDonald | 332/11 D |
| 5,870,046 | * | 2/1999 | Scott et al. | 341/143 |
| 6,107,948 | * | 8/2000 | Scott et al. | 341/143 |

\* cited by examiner

*Primary Examiner*—Peguy Jeanpierre
(74) *Attorney, Agent, or Firm*—Moonray Kojima

(57) ABSTRACT

A sigma-delta analog-to-digital (A/D) converter comprising an input terminal, an adder, an integrator, a comparator and a flip flop circuit connected in series, with an output signal of the flip flop circuit being provided at an output terminal, and being fed back to the adder through a digital-to-analog (D/A) converter, so that the A/D converter provides a pulse density signal corresponding to a given input signal, wherein the comparator output is isolated from the input terminal of the flip flop circuit, and the output of the flip flop circuit is isolated from the D/A converter input terminal thereby achieving reduction of current consumption. The invention is useful in two wire vortex flowmeters, for example.

23 Claims, 27 Drawing Sheets

FIG. 10
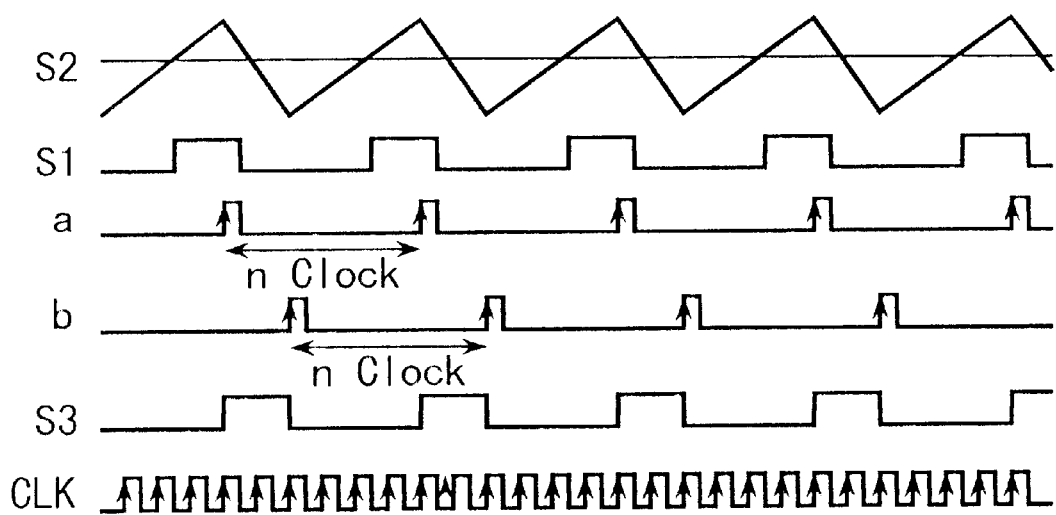
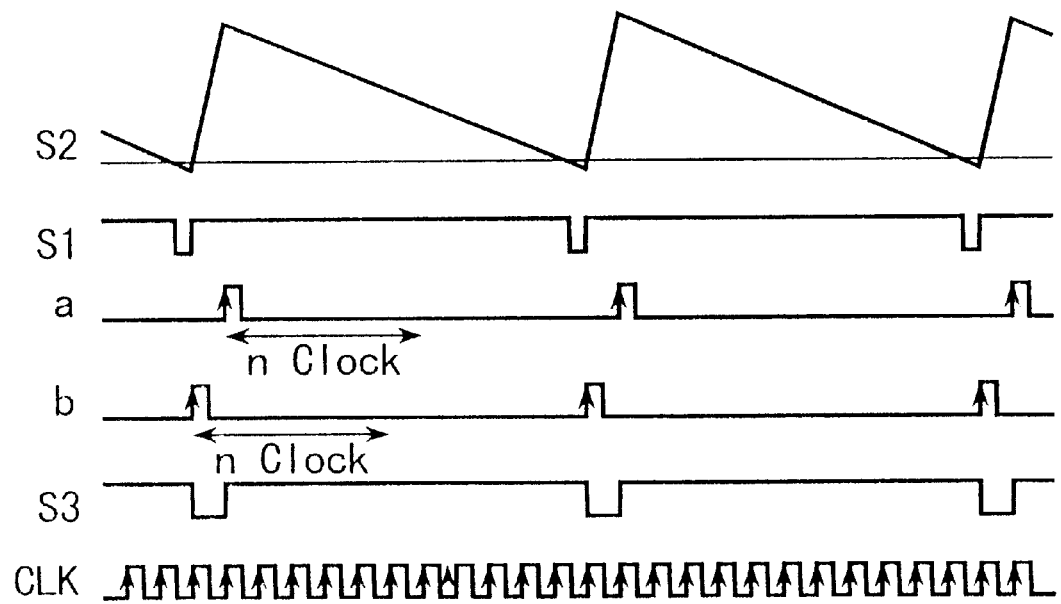

FIG. 11

| Sampling frequency | $fs$ | $\dfrac{n}{2} \cdot fs$ |
|---|---|---|
| Maximum frequency of FF output | $\dfrac{fs}{2}$ | $\dfrac{fs}{2}$ |
| SN | 1 | $\dfrac{n}{2}$ |

FIG. 13

| | | |
|---|---|---|
| Sampling frequency | $fs$ | $\dfrac{n}{2} \cdot fs$ |
| Maximum frequency of FF output | $\dfrac{fs}{2}$ | $\dfrac{fs}{2}$ |
| SN | 1 | $k^2 \left(\dfrac{n}{2}\right)^3$ |

FIG. 15
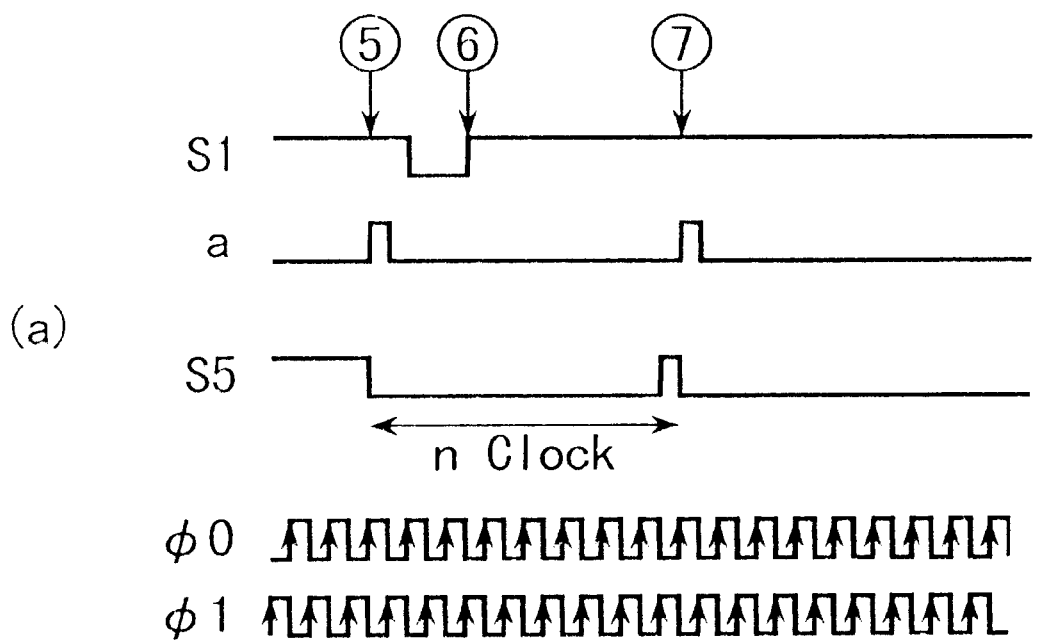
(a)
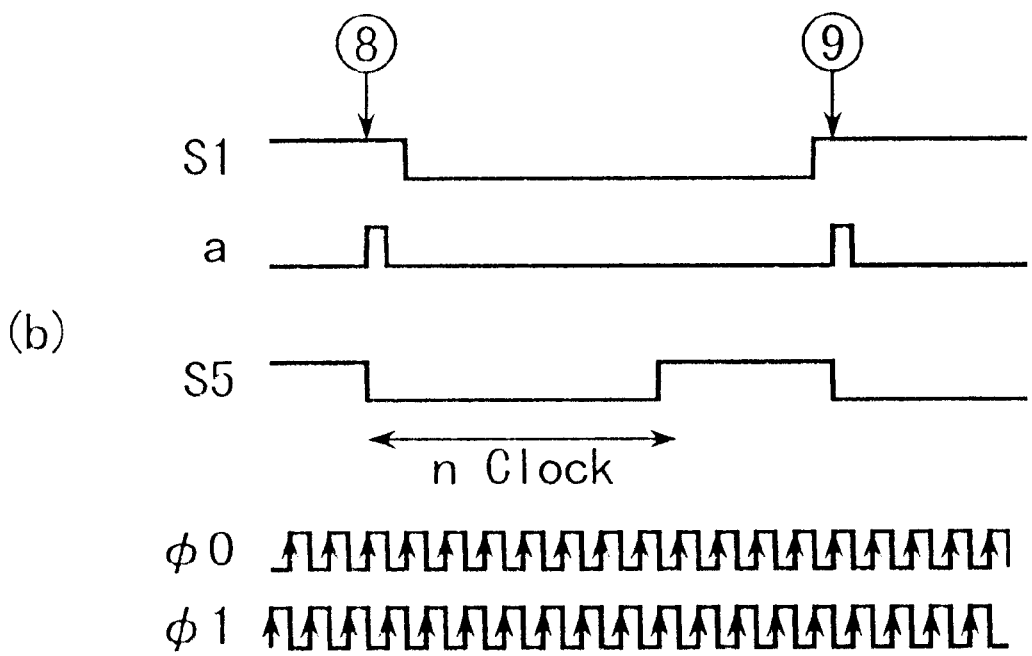
(b)

FIG. 21

| Comparator 12 Output | Isolation Circuit 350 | | First Startup Circuit 400 | | |
|---|---|---|---|---|---|
| | Sin2 | Rin2 | Error Judgment | ESo | ERo |
| H | ⊓ | | Correct | | |
| | ⊓ | ⊓ | Error | | ⊓ |
| L | | ⊓ | Correct | ⊓ | |
| | | | Error | | |

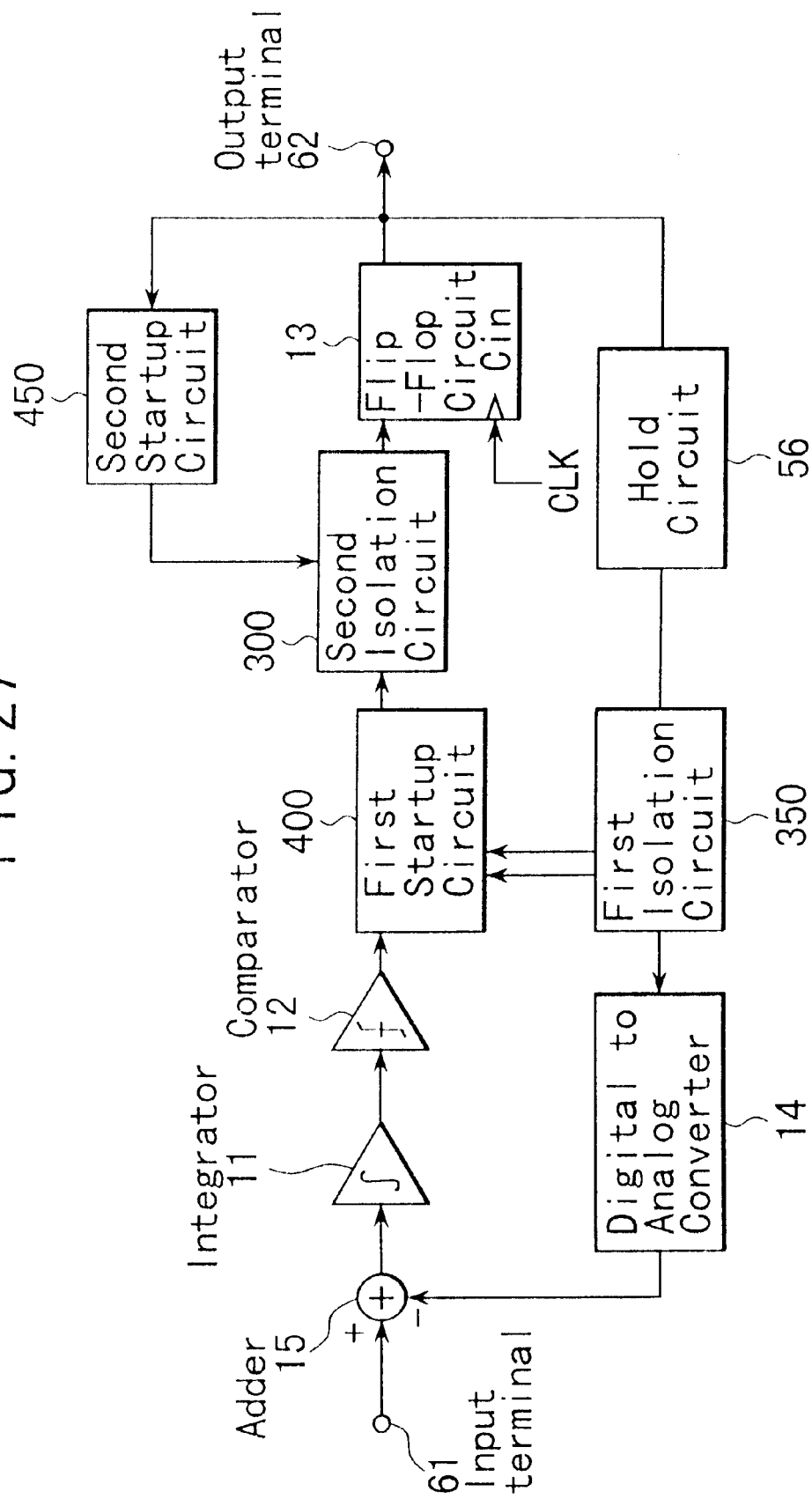
F I G. 27

SIGMA-DELTA ANALOG-TO-DIGITAL CONVERTER

BACKGROUND OF THE INVENTION

This invention relates to a sigma-delta analog-to-digital converter for use, for example, with a two wire vortex flowmeter that uses a sensor to detect the vortex frequency occurring according to the flow rate of fluid under measurement, and outputs the measured flow rate to an external device in the form of a current signal that is also used as the operating power source for the external device. More specifically, the invention relates to an improved sigma-delta analog-to-digital converter incorporating means for isolating input signals in order to reduce current consumption.

DESCRIPTION OF THE PRIOR ART

A conventional vortex flowmeter is described in FIG. 1, wherein an input signal from a sensor 1, for detecting vortexes produced by a vortex shredder, is amplified by an amplifier 2 and inputted to an anti-aliasing filter 3. The signal inputted to the anti-aliasing filter 3 is processed thereby so that the high frequency components thereof are removed, and then the resulting signal is inputted to a sigma-delta analog-to-digital converter 4. The signal inputted to the sigma-delta analog-to-digital converter 4 is converted thereby into a digital signal and further inputted to a digital filter 5. The signal inputted to the digital filter 5 is thereby filtered and changed to pulses for inputting to a CPU 6. The CPU 6 applies processes, such as conversion to a flow rate signal, to the inputted signal, and then the CPU outputs a flow rate signal to an output circuit 7. The output circuit 7 outputs a 4–20 mA flow rate signal to an external device. In the case of a two wire vortex flowmeter, a 4 to 20 mA signal which is outputted also serves as an operating power source for the circuit of FIG. 1.

If the vortex flowmeter of FIG. 1 has a sensor 1 which is not isolated from ground, the input signal thereto must be isolated from the internal circuit at a certain location within the circuit in order to obtain the correct flow rate signal. In a conventional vortex flowmeter, an isolation circuit is added to the sigma-delta analog-to-digital converter 4, so that such isolation is achieved at the location shown by the dashed line A in FIG. 1.

FIG. 2 is a schematic view showing a conventional sigma-delta analog-to-digital converter 4. FIG. 3 is a timing chart showing waveforms of signals at various points in the circuit of FIG. 2.

In FIG. 2, a signal Ain is inputted, from an anti-aliasing filter 3, to an input terminal 61 and is fed through an adder 15 to an integrator 11. The output of integrator 11 is then applied to a comparator 12. The output signal of comparator 12 is inputted to a flip flow circuit 13, whose output signal is then fed to a digital filter 5 disposed in a subsequent stage connected to a comparator through an output terminal 62. An internal clock signal CLK, that serves as a sampling signal of the A/D converter, is supplied to flip flop circuit 13, whose ouput signal is then fed through a digital-to-analog converter 14 and then to the negative terminal of adder 15.

In the A/D converter, the signal Ain is integrated by integrator 11, whose integral signal A11 is then compared by comparator 12 with a value preset therein. The resulting comparative output D12 is inputted to flip flop circuit 13, which repeats high and low outputs at the timing of clock signal CLK to produce an output signal D13. The output signal D13 is converted to an analog signal A14 by D/A converter 14, and then the analog signal A14 is added to the signal Ain by adder 15.

By repeating the operation, the A/D converter 4 can output a pulse density signal corresponding to signal Ain such as the signal labeled D13 in FIG. 3. The A/D converter 4 features a single output (note, some sigma-delta A/D converters have multiple bit outputs), small scale hardware, ease of power saving, and a high resolution that can be attained by increasing the sampling rate and without requiring any adjustment. Accordingly, the converter has been widely used for various instruments, such as the vortex flowmeter.

FIG. 4 shows an example of a sigma-delta A/D converter, wherein an isolation circuit is provided in the converter circuit to isolate the input signals at the part indicated by the dashed line A in FIG. 1. In FIG. 4, an isolation circuit 25 is disposed between the clock signal CLK and the output signal of the flip flop circuit 13 shown in FIG. 1, in order to isolate the circuit, including the sensor 1, on the left side of the dashed line A from the circuit, including the CPU 6, on the right side of the dashed line A. A circuit configured in such a manner is disclosed in U.S. Pat. No. 5,372,046, for example.

However, the isolation mechanism requires that a high frequency clock signal be properly isolated. This isolation and transferrring a high frequency signal requirees a large amount of current. Normally, a sigma-delta A/D converter provides higher resolutions when an input signal is sampled at a higher frequency, since the quantization noise decreases as the sampling signal becomes faster. Generally, an input signal must be sampled at a frequency which is several hundred times as high as the signal bandwith. Since vortex flowmeters use a signal bandwidth of several hundred kilohertz, the sampling frequency must be at least several hundred kilohertz. Isolating and transferring such a high frequency signal requires a large amount Of current.

A two wire vortex flowmeter uses a current signal of 4 to 20 mA relative to the measurement range, in order to transmit a flow rate signal, which also serves as an operating power source to external equipment. Thus, the A/D converter must be operated so that is total current consumption is less than 4 mA. For this reason, the sigma-delta A/D converter of FIG. 4 has a problem. As a result of the restriction on the amount of current consumed by the isolation circuit, the sampling frequency, or resolution, can only be increased to the extent at which isolation can be achieved at current levels no higher than 4 mA.

SUMMARY OF THE INVENTION

Accordingly, it is an object of the invention to overcome the aforementioned and other deficiencies and disadvantages of the prior art.

Another object is to provide a sigma-delta A/D converter having an isolation mechanism that functions at current level which are no lower than 4 mA and enables high speed sampling.

BRIEF DESCRIPTION OF THE DRAWINGS

FIG. 10 is a timing chart depicting signal waveforms at various points of the embodiment shown in FIG. 8.

FIG. 11 is a table depicting comparison between a conventional sigma-delta A/D converter and the embodiment of FIG. 8.

FIG. 13 is a table depicting comparison between a conventional sigma-delta A/D converter and the embodiment of FIG. 12.

FIGS. 15*a–b* is a timing chart depicting signal waveforms at various points of the trigger control circuit of FIG. 14.

FIG. 21 is a table depicting behavior of a first driving circuit of the embodiment of FIG. 16.

FIG. 27 is a schematic block diagram depicting a ninth illustrative embodiment of the invention which is another variation of the embodiment of FIG. 16.

DETAILED DESCRIPTION OF THE PREFERRED EMBODIMENTS

Figure 4:
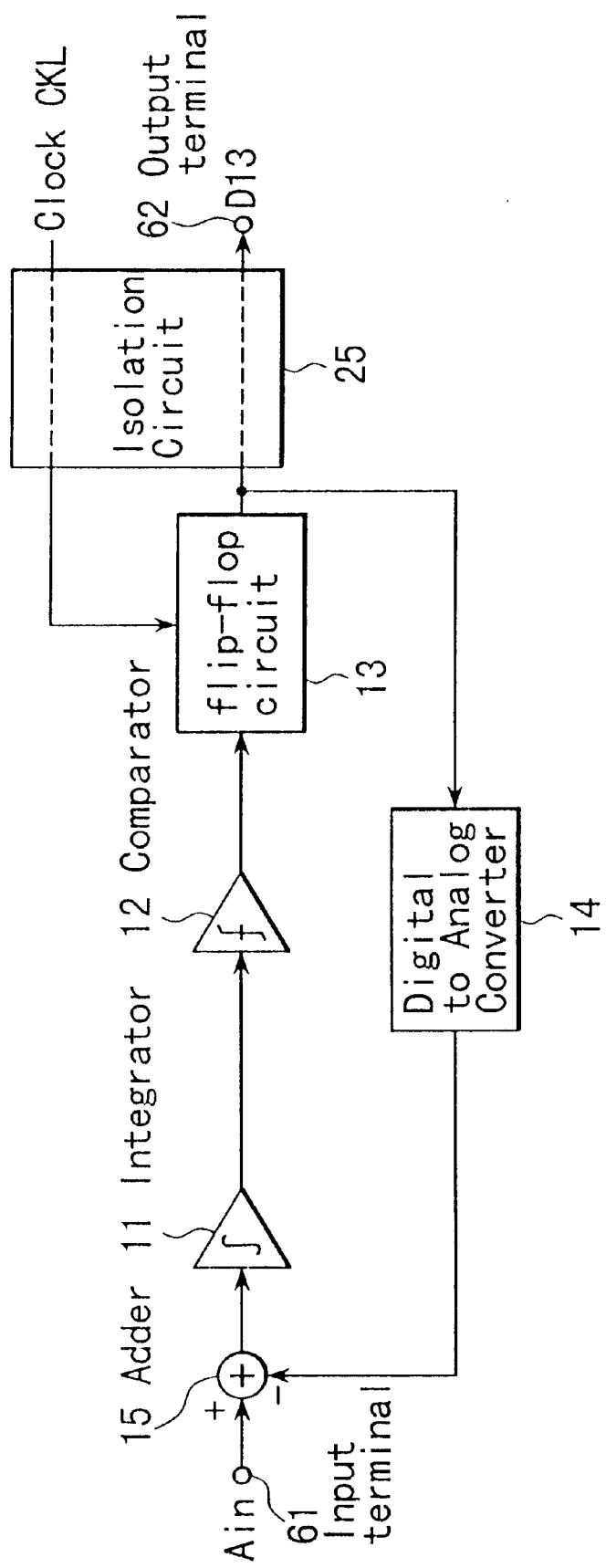
FIG. 4 is a schematic block diagram depicting another conventional sigma-delta A/D converter.
Figure 5:
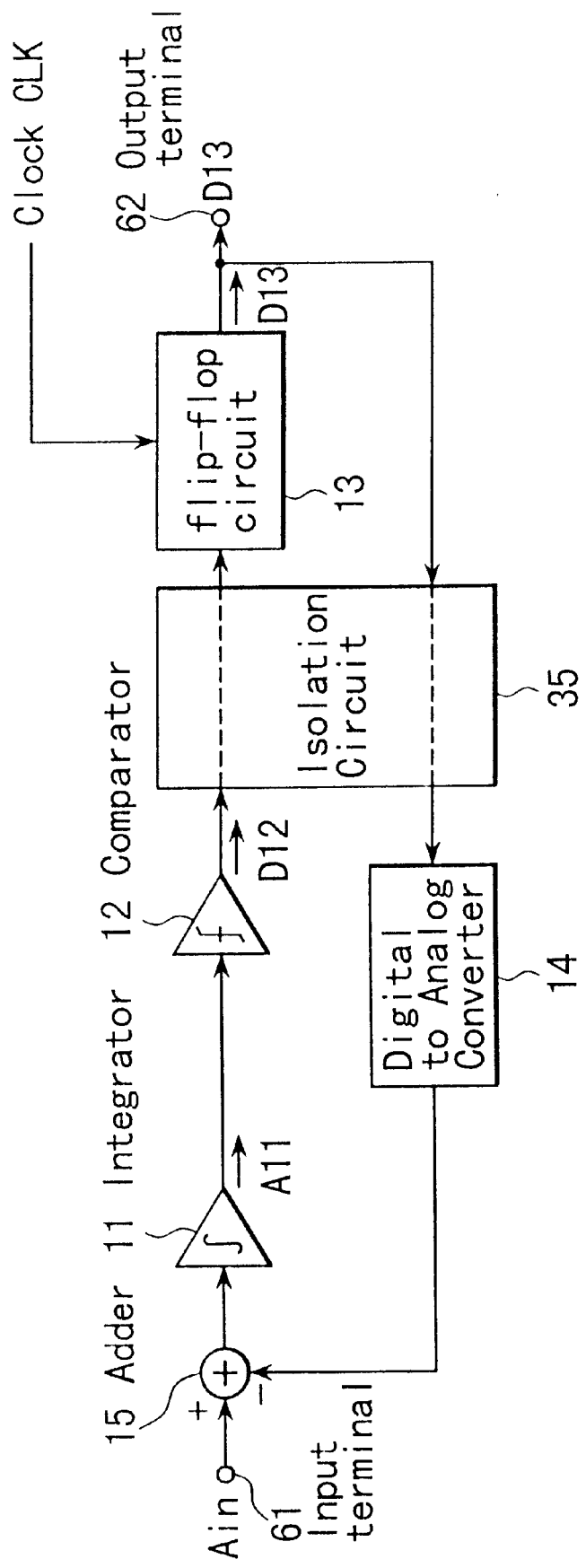
FIG. 5 is a schematic block diagram depicting a first illustrative embodiment of the invention.

FIG. 5 shows a sigma-delta A/D converter wherein the same components as in FIG. 4, et seq, have the same symbols, and description thereof is omitted hereat for sake of convenience of description. Similarly, in the other embodiments the same symbols will denote the similar components and descriptions thereof thereat will be omitted for sake of convenience.

FIG. 5 differs from FIG. 4 in that an isolation circuit 35 is disposed between an output terminal of a comparator 12 and an input terminal of a flip flop circuit 13 and between the output terminal of the flip flop circuit 13 and an input terminal of a digital-to-analog (D/A) converter 14.

The output singal D12 of the comparator 12 can be readily isolated from the output signal D13 of the flip flop circuit 13 since both output signals deal with binary high or low signals. Unlike the circuit of FIG. 4, a high frequency clock signal CLK does not pass through the isolation circuit of FIG. 5. In addition, the output signal D13 of the flip flop circuit 13 in principle has a frequency which is lower than one half the frequency of the clock signal CLK. As described, an isolation circuit generally consumes more current as the frequency of the signal being isolated becomes higher. Conversely, the current consumption decreases as the frequency of the signal being isolated becomes lower. Since the signal to be isolated by the isolation circuit 35 is a low frequency binary signal, no large current is necesary for the isolation circuit to isolate the signal. Hence, the isolation circuit 35 can be readily realized using a low cost circuit of low current consumption. In addition, the frequency of the clock signal CLK that governs the resolution of the sigma-delta A/D converter can be readily increased without being subject to the foregoing restriction, since the clock signal CLK does not pass through the isolation circuit 35.

In the foregoing description, only a specific preferred embodiment is discussed. Such embodiment is to be considered only as being illustrative and not restrictive. The invention may be embodied in other ways without departing from the spirit and essential characteristics thereof. Accordingly, it is to be understood that all modifications and extensions falling within the spirit and scope of the invention are covered by the appended claims.

Figure 6:
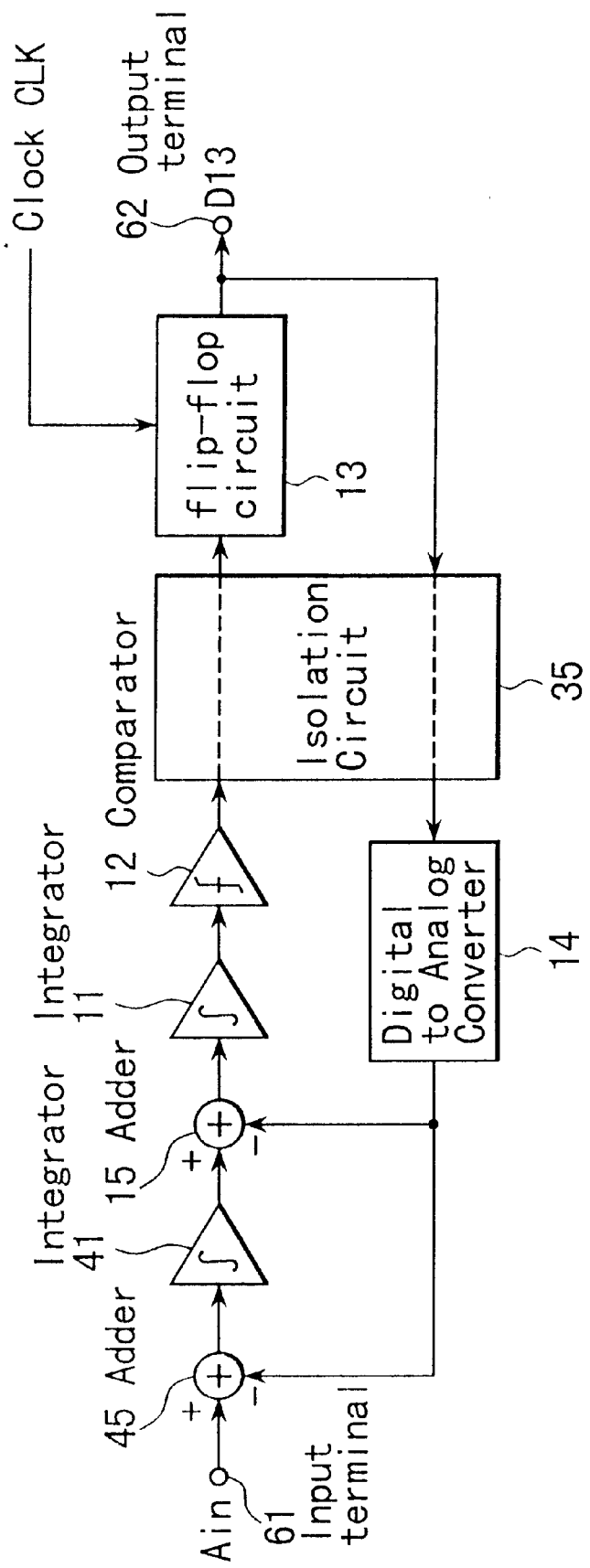
FIG. 6 is a schematic block diagram depicting a second illustrative embodiment of the invention.

For example, the isolation means described in FIG. 5 is also effective for the double integrator embodiment shown in FIG. 6, wherein an adder 45 and integrator 41 are added. It is possible to reduce the quantization noise of a sigma-delta A/D converter and improve the resolution thereof, when compared with the single integrator type, by increasing the number of integrators, as shown in FIG. 6.

Figure 7:
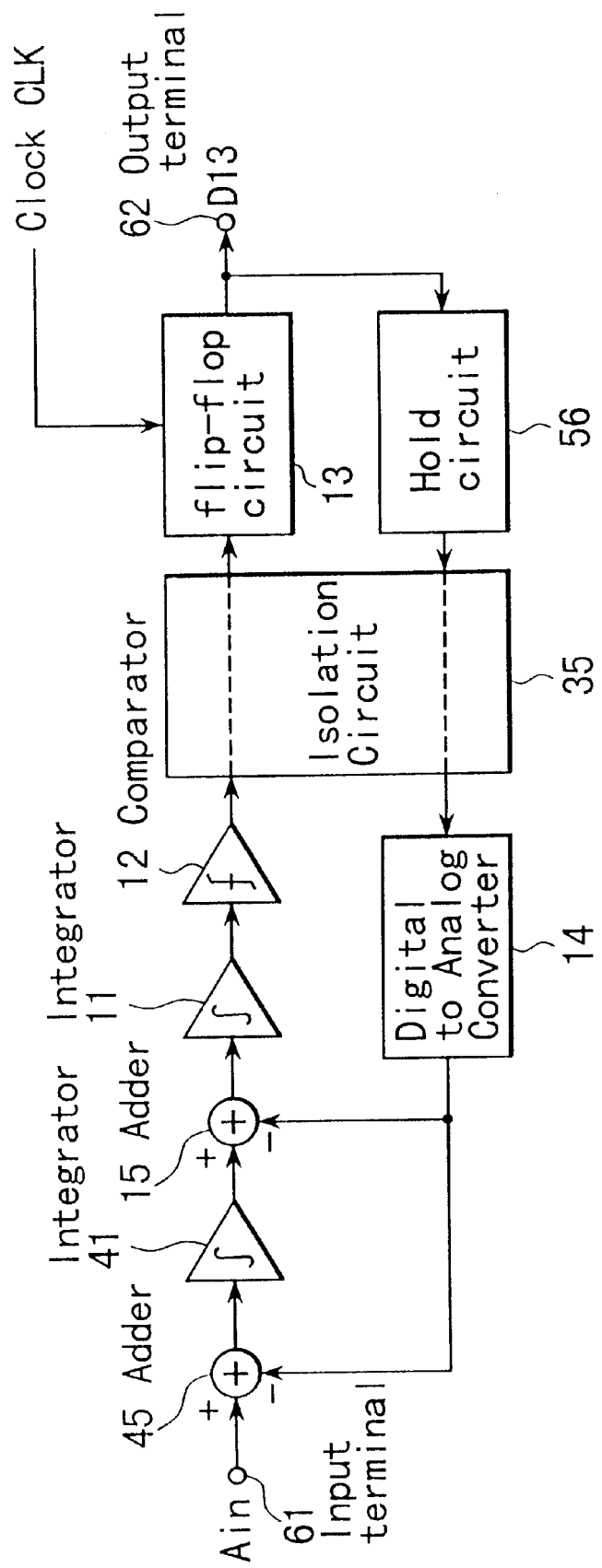
FIG. 7 is a schematic block diagram depicting a third illustrative embodiment of the invention.

The isolation means described in FIG. 5 is also effective for a sigma-delta A/D converter where a hold circuit 56 is disposed between the output terminal of the flip flop circuit 13 and the D/A converter 14, as shown in FIG. 7. By adding the hold circuit 56, as as shown in FIG. 7, the operating speed of the integrator 11 or comparator 12 can be kept low. This makes it possible to produce a sigma-delta A/D converter which requires less cost and operates at reduced currents.

Figure 1:
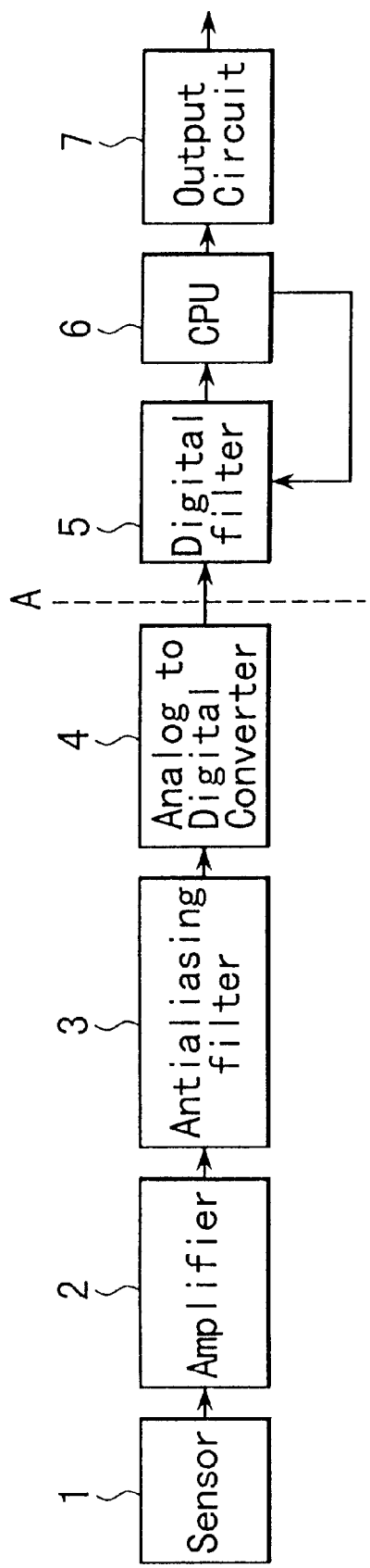
FIG. 1 is a schematic block diagram depicting a conventional vortex flowmeter.
Figure 2:
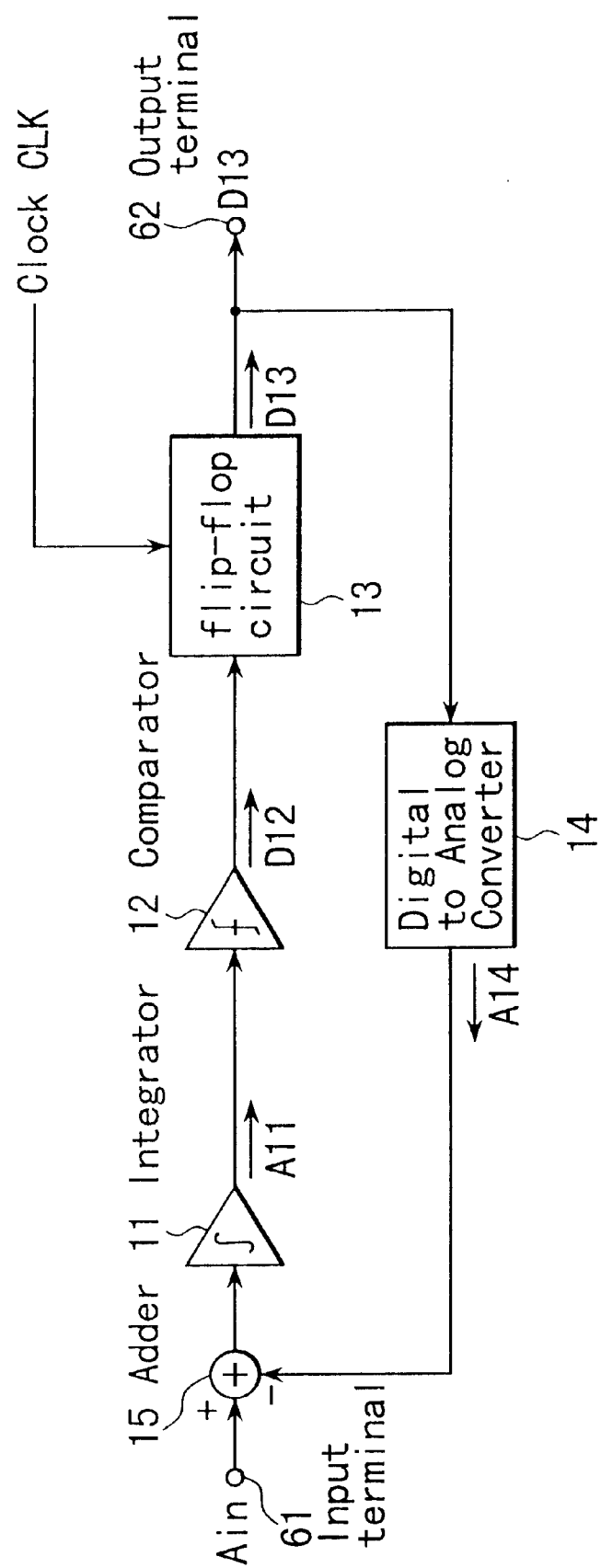
FIG. 2 is a schematic block diagram depicting a conventional sigma-delta analog-to-digital(A/D) converter.
Figure 3:
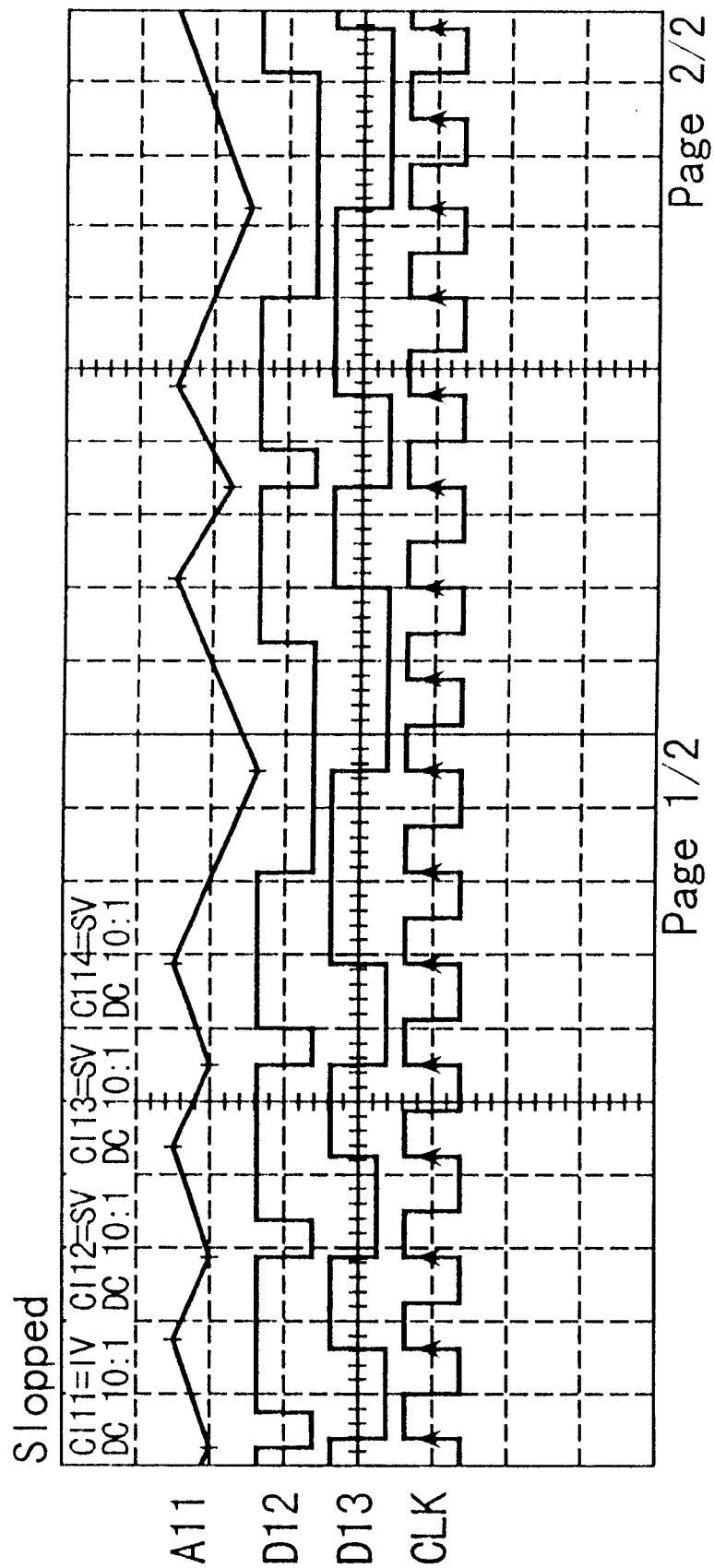
FIG. 3 is a timing chart depicting signal waveforms at various points of a conventional sigma-delta A/D converter.
Figure 8:
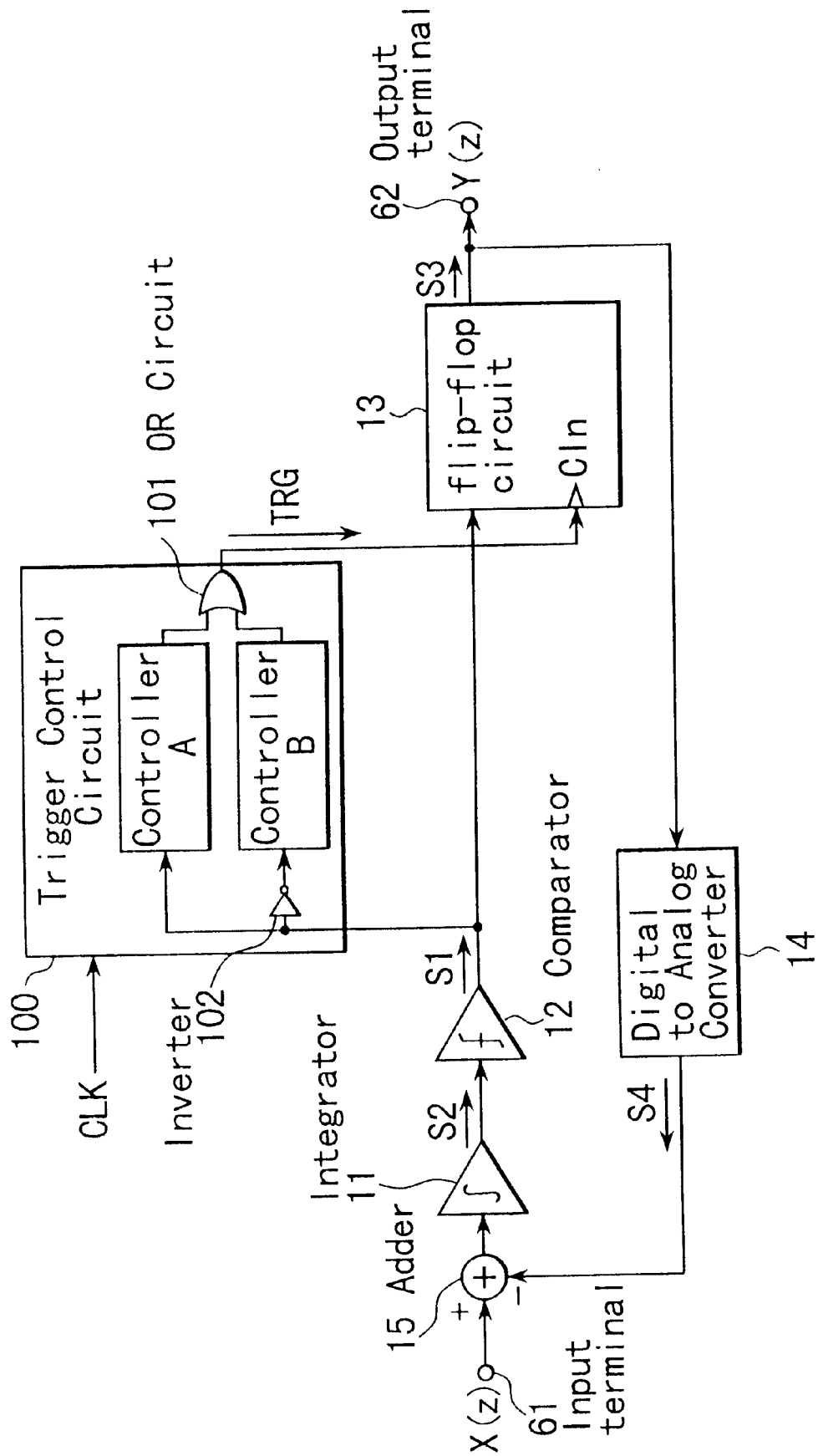
FIG. 8 is a schematic block diagram depicting a fourth illustrative embodiment of the invention.

FIG. 8 differs from FIG. 2 in that the output signal S1 of the comparator 12 is inputted to a trigger control circuit 100 and the output signal TRG of the trigger control circuit 100 is supplied to the clock input terminal Cin of the flip flop circuit 13. The trigger control circuit 100 is designed to limit the frequency of the occurrence of the trigger signals outputted to the flip flop cicuit 13, and comprises a controller A that detects an upward going edge of the output signal S1 of the comparator 12 to generate a trigger component signal "a"; and a controller B that detects a downward going edge of the output signal S1 of the comparator 12 to generate a trigger component signal "b". The controllers A and B are driven by the times of the clock signal CLK that serves as the sampling signal of the sigma-delta A/D converter. The trigger component signals "a" and "b" generated by the controllers A and B are inputted to an OR circuit 101, the output signal of which is then fed to the clock input terminal Cin of the flip flop circuit 13 as a trigger signal TRG. The controllers A and B comprise the same circuit configuration, wherein (1) the output signal of the comparator 12 is directly inputted to the controller A disposed in the trigger control circuit 100 so that and upward going edge is detected to generate a trigger component signal "a"; and (2) the inverted output signal of the comparator 12 provided by the inverter 102 disposed in the trigger control circuit 100 is inputted to the controller B so that a downward going edge is detected and a trigger component signal "b" is generated.

Figure 9:
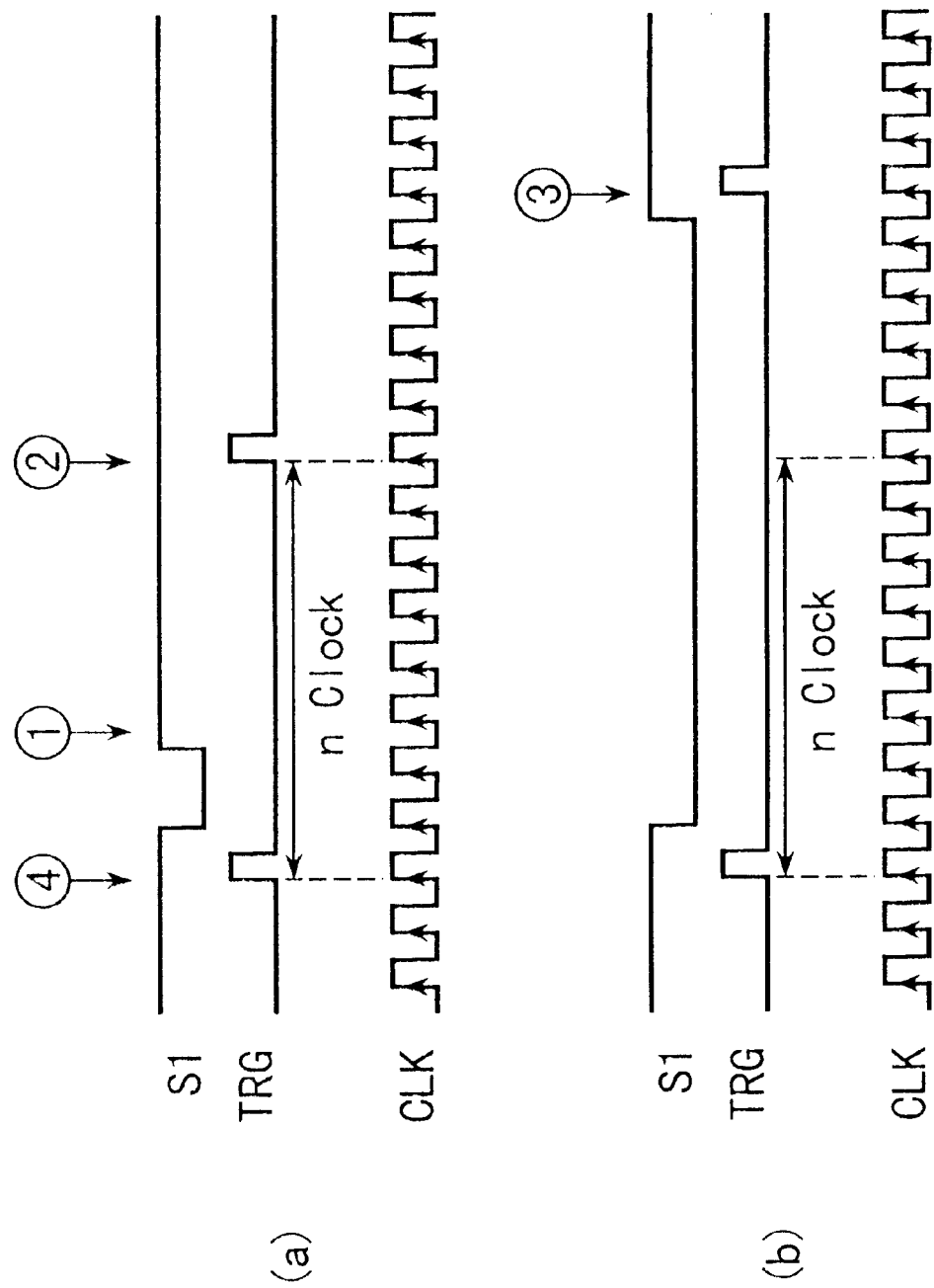
FIGS. 9*a–b* is a timing chart depicting signal waveforms at various points of the trigger control circuit shown in FIG. 8.

FIG. 9 are waveform charts (a) and (b) which show the behavior of the trigger control circuit 100, namely, the relationship between the clock signal CLK, the output signal S1 of the comparator 12, and the trigger signal TRG which is the output signal of the trigger control circuit 100. The trigger control circuit 100 is designed to limit the frequency of occurrence of trigger signals. The frequency is limited by controlling the time interval between the previous signal TRG and the next signal TRG. More specifically, when the output signal S1 of the comparator 12 makes a low to high transition before a predetermined delay of "n" clock pulses from the occurrence of the previous trigger signal TRG, then, the trigger control circuit 100 generates another trigger signal TRG after a delay of "n" clock pulses from the occurrence of the previous trigger signal TRG.

In the waveform chart (a) of FIG. 9, the output signal S1 of the comparator 12 is latched by the flip flop circuit 13 at the time marked ① in the case of a conventional sigma-delta A/D converter. In the case of the invention, the output signal S1 of the comparator 12 is latched at the time marked ② after the predetermined delay of "n" clock pulses from the time marked ④ at which the previous trigger signal TRG occurred.

Also, as shown in waveform chart (b) of FIG. 9, the trigger control circuit 100 generates a trigger signal TRG at the time marked ③ when an upward going edge of the clock signal CLK is detected immediately after the low to high transition of the output signal S1 of the comparator 12 when that transition takes place after the predetermined delay of "n" clock pulses from the occurrence of the previous trigger signal TRG. This behavior is the same as that of a conventional sigma-delta A/D converter.

FIG. 10 shows waveform charts useful in explaining operation of the invention which is provided with a trigger control circuit 100. The top waveform chart of FIG. 10 shows the relationship between the input signal S2 applied to the comparator 12, the output signal S1 of the comparator 12, the trigger component of signal "a", the trigger component of signal "b", the output signal S3 of the flip flop circuit 13, and the clock signal CLK when a signal whose level is close to one half of the input range is applied to the invention embodiment. Similarly, the bottom waveform chart of FIG. 10 shows the relationship between he same signals and component signals as discussed above whose level is close to the full scale of the input range.

In the top waveform chart of FIG. 10, the output signal S3 of the flip flop circuit 13 does not change immediately even when the output signal S1 of the comparator 12 changes, as the trigger signal TRG, which is a logical OR of the trigger component signals "a" and "b", is placed under restriction. More specifically, the frequency of change in the pulse density signal inputted to the D/A converter 14 is reduced since the trigger signal TRG of the flip flop circuit 13 is placed under restriction by the trigger control circuit 100. Hence, the output signal of the D/A converter 14 is kept constant for a specific length of time, thereby reducing the operating speed of the analog circuit that follow the adder 15.

The output signal of the flip flop circuit in a conventional sigma-delta A/D converter changes most frequently when a signal whose level is one half the input range is applied. The frequency of change (called "maximum output frequency") is one half the frequency of the clock signal CLK. In the case of the invention, the frequency is one nth of the frequency of the clock signal CLK. This holds true, however, only when "n" is equal to or greater than 3. The A/D converter operates operates in the same way as a conventional A/D converter when "n" is equal to 1 or 2.

The bottom waveform chart of FIG. 10 shows when a signal, whose level is close to the full scale of the input range, is applied to the sigma-delta A/D converter of the invention. The output signal S3 of the flip flop circuit 13 changes less frequently. This is because (1) no restriction is placed on the trigger signal TRG by the trigger control circuit 100, as the predetermined delay of "n" clock pulses has already occurred by the time the output signal S1 of the comparator 12 changes; and (2) the trigger control circuit 100 generates a trigger signal TRG at the time when an upward going edte of the clock signal CLK is detected immediately after a change in the output signal S1 of the comparator 12. This behavior is the same as that of the conventional sigma-delta A/D converter.

In other words, when the delay of "n" clock pulses is set properly, trigger control circuit 100 places the trigger signal TRG under restriction only when an input signal X(z), whose level is about one half the input range at which a pulse density signal Y(z) is most frequently outputted, is applied. On the other hand, the trigger control circuit 100 does not place the trigger signal TRG under restriction when an input signal X(z), whose level is close to zero or the full scale of the input range at which a pulse density signal Y(z) changes less frequently, is applied.

An error found at the input terminal of the comparator 12 is n/2 times that of the conventional sigma-delta A/D converter. Hence, the electrical energy of quantization noise is $n^2/4$ times as large and the signal to noise ratio SN is $n/n^2$ times as large. Hence, the signal to noise ratio SN11 of the embodiment comprising a single integrator configuration is:

$$SN11 = 4/n^2 \times 9/(16 \times \pi^2) \times (fc/fs)^{-3} \qquad (1)$$

On the other hand, the frequency at which the output of the embodiment changes is reduced to a value of 2/n times the original. Hence, when attention is directed to the operating speed of the analog circuit, including the comparator 12, and the speed is kept equal to that of the conventional method, it can be understood that the clock frequency, i.e. sampling frequency, can be increased to a value of n/2 times that of the original.

FIG. 11 shows a comparison of the result of normalization of the signal to noise ratios of a conventional method (second column) and the invention(third column) by the highest frequency fS/2 of the output of the conventional A/D converter. The results mean that in the invention, it is possible to improve the advantage over the conventional method in terms of signal to noise ratio SN by a factor of n/2, without having to increase the operating speed of the analog circuit.

Figure 12:
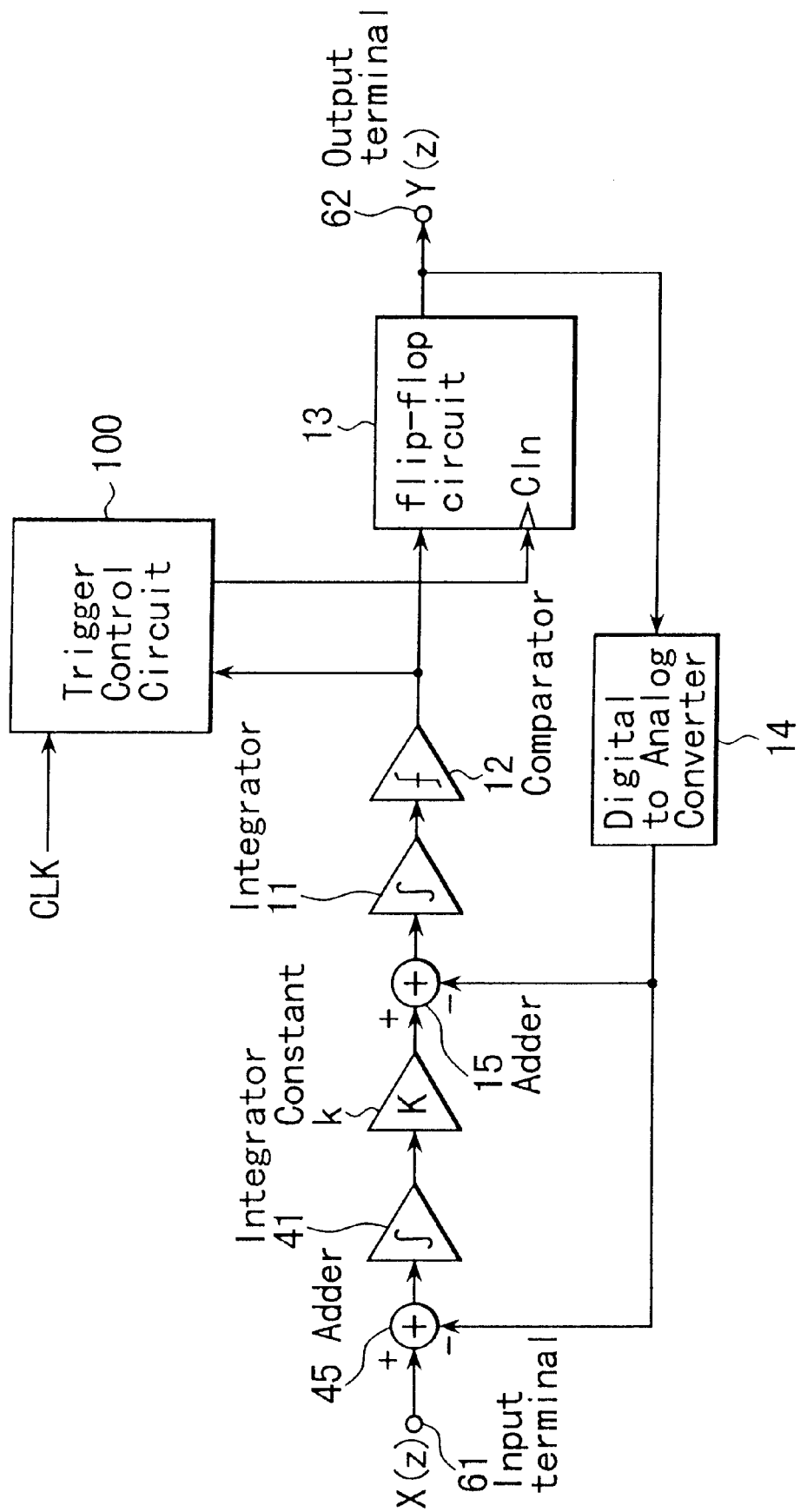
FIG. 12 is a schematic block diagram depicting a fifth illustrative embodiment of the invention, which is a variation of the embodiment of FIG. 8.

As shown in FIG. 12, the sigma-delta A/D converter of the invention may comprise a double integrator, wherein the output of the primary integrator 41 is multiplied by a certain constant "k" to stabilize the operation of the double integrator embodiment. The operation can be stabilized by multiplying the output signal of the primary integrator 41 by the following constant "k":

$$k \leq 2/n \quad (2)$$

The signal to noise ratio SN12 is:

$$SN12 = k^2 \times (4/n^2) \times 15/(64 \times \pi^4) \times (fc/fs)^{-5} \quad (3)$$

Similarly to FIG. 11, the table of FIG. 13 shows comparison of the results of normalizing the signal to noise ratios of the conventional method (second column) and the invention (third column) by the highest frequency of the output of the conventional sigma-delta A/D converter. The results mean that in the method of the invention, it is possible to improve the advantage over the conventional method in terms of the signal to noise ratio SN by a factor of $k^2 \times (n/2)^3$.

Figure 14:
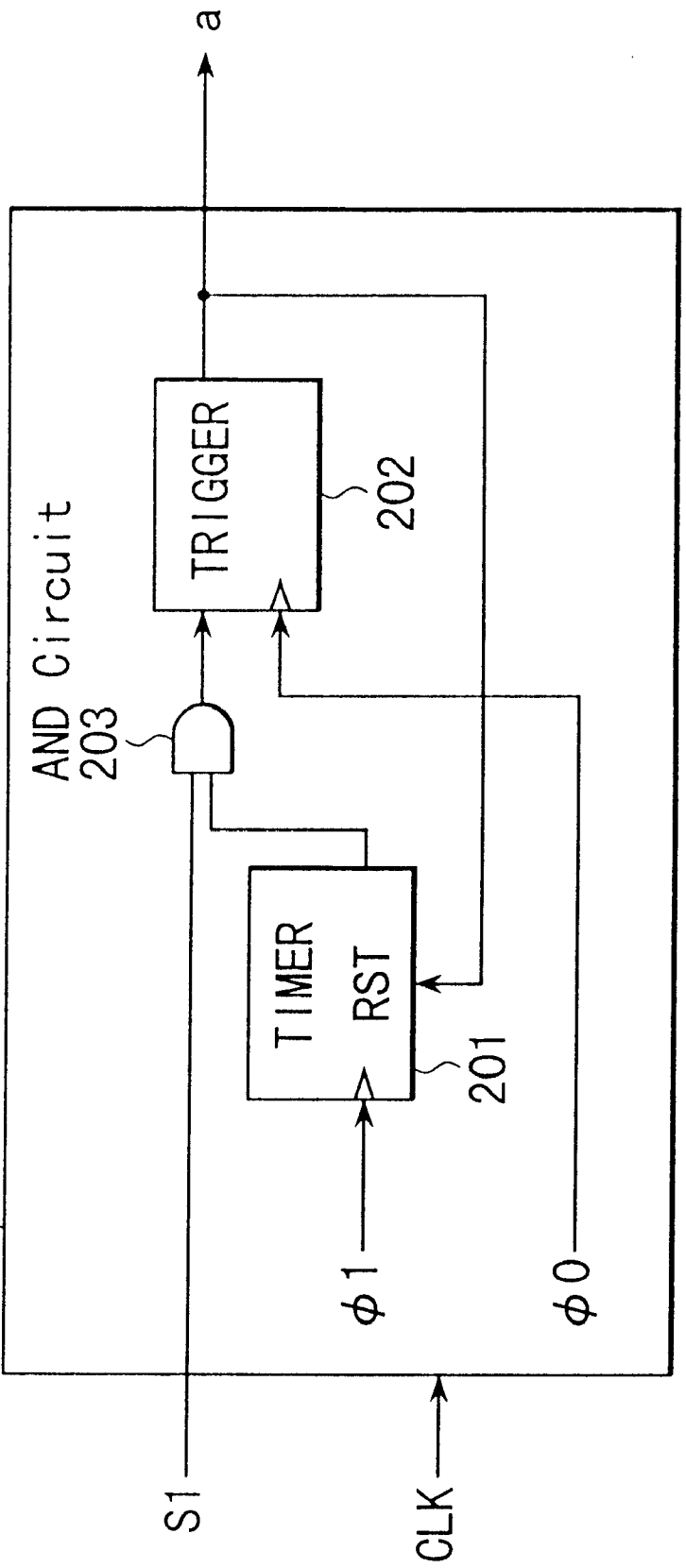
FIG. 14 is a schematic block diagram depicting an example of a trigger control circuit usuable in the embodiment of FIG. 8.

FIG. 14 shows an example of a controller A used in the invention, wherein the output signal S1 of the comparator 12 (see for example FIG. 8 et seq) is supplied to one of the input terminals of an AND circuit 203 and the output terminal of the AND circuit 203 is connected to an input terminal of a trigger circuit 202. A clock signal ø0 is inputted to the trigger circuit 202. The output terminal of the trigger circuit 202 is connected to one of the input terminals of OR circuit 101 disposed in trigger control circuit 100 (see FIG. 8) as the trigger component signal "a"; and to the reset terminal RST of timer circuit 201. A clock signal ø1, opposite in phase to clock signal ø0, is inputted to timer circuit 201. The expiry signal S5 of timer 201 is supplied to the other input terminal of AND circuit 203. The clock signals ø0 and ø1 are the result of processing clock signal CLK inputted to the controller A so that the clock signal CLK is separated into the two different clock signals ø0 and ø1.

FIG. 15 shows signal waveforms at various points of controller A, such as depicted in FIG. 14, wherein waveform chart (a) of FIG. 15 shows the operating waveforms of controller A when the output of comparator 12 makes a low to high transition before the predetermined delay of "n" clock pulses from the occurrence of the previous trigger signal TRG, as discussed before with respect to waveform chart (a) of FIG. 9. Waveform chart (b) of FIG. 15 shows the operating waveforms of controller A when the output signal of comparator 12 makes a low to high transition after a predetermined delay of "n" clock pulses from the occurrence of hte previous trigger signal TRG, as discussed before with respect to waveform chart (b) of FIG. 9.

As shown in waveform chart (a) of FIG. 15, the controller A outputs a trigger component signal "a" through trigger circuit 202 and thereby resets timer circuit 201, thereby beginning the count of the predetermined delay of "n" clock pulses. This takes place at the time indicated by the mark ⑤. When the output signal of the comparator 12 makes a low to high transition before the timer circuit 201 timing expires, the input signal applied to the trigger circuit 202 remains low since the expiry signal S5 of the timer circuit 201 supplied to the AND circuit 203 still remains low. This takes place at the time indicated by the mark ⑥. When the output signal of comparator 12 is high, i.e. when the timer circuit 201 timing expires, and thus the expiry signal S5 becomes high, the output signal of the AND circuit 203 also becomes high. This causes the input signal applied to the trigger circuit 202 to become high and the trigger circuit 202 to output the trigger component signal "a". This takes place at the time indicated by the mark ⑦.

As shown in the waveform chart (b) of FIG. 15, the controller A outputs the trigger component signal "a" through the trigger circuit 202 and thereby resets the timer circuit 201, thereby beginning the count of the predetermined delay of "n" clock pulses. This takes place at the time indicated by the mark ⑧. When the output signal S1 of the comparator 12 is not high, such as when the timer circuit 201 timing expires, and thus expiry signal S5 becomes high, the output signal S1 is held as it is. The trigger component signal "a" is outputted when the output signal S1 becomes high the next time. This takes place at the time indicated by the mark ⑨.

Accordingly, the controller A detects the upward going edge of the output signal S1 of the comparator 12 to generate the trigger component signal "a". On the other hand, controller B detects the downward going edge of the output signal S1 of the comparator 12 to generate the trigger component signal "b". This is achieved by feeding the output signal S1 of the comparator, through an inverter, to an input terminal of a controller B which has the same circuit configuration as the controller A shown, for example, in FIG. 14.

Furthermore, an isolation circuit, for example as shown in FIG. 5, can be disposed between a comparator 12 and a flip flop circuit 13 and between the output terminal of the flip flop circuit 13 and a digital-to-analog converter 14 (see, e.g. FIG. 12).

Figure 16:
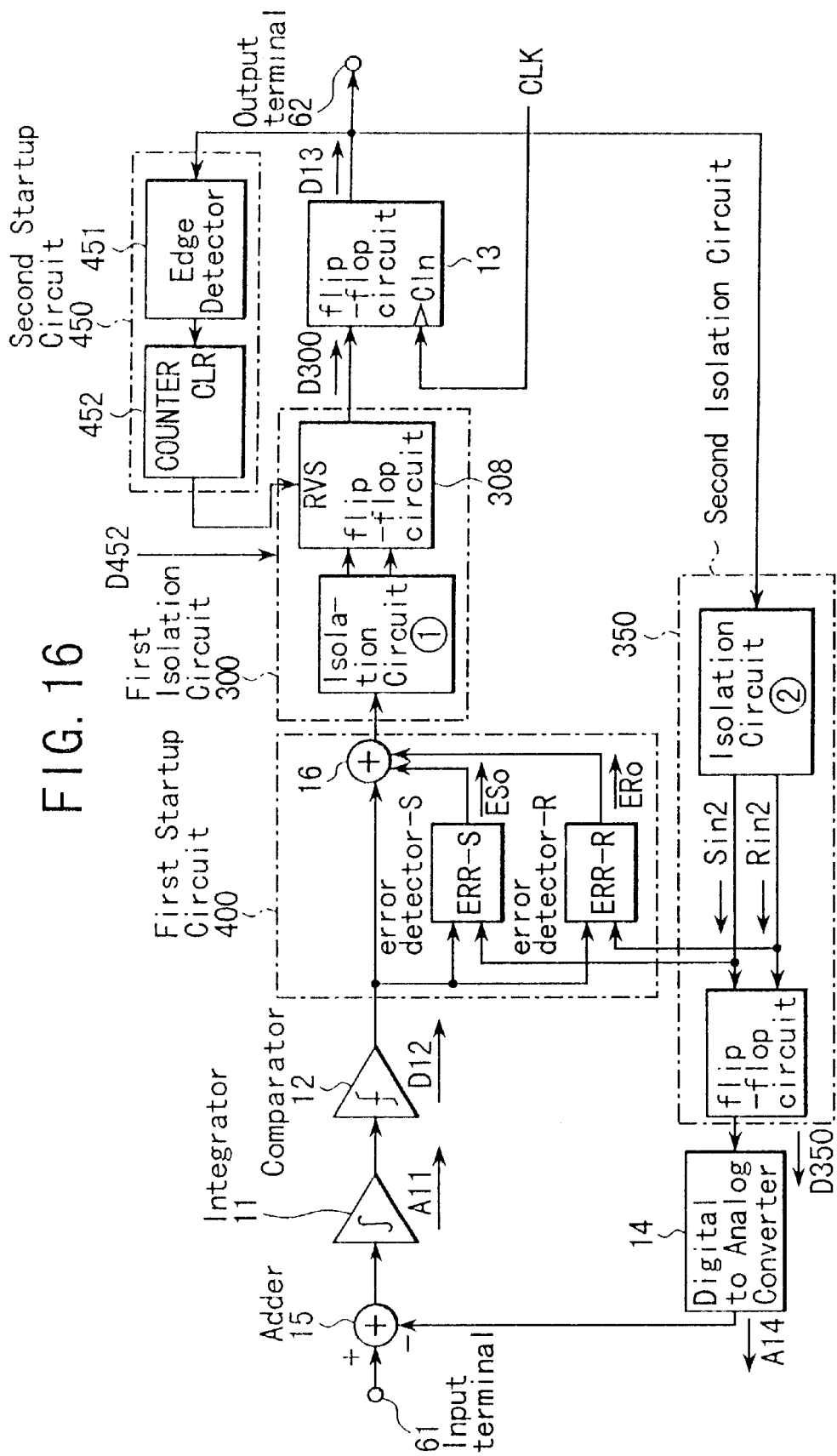
FIG. 16 is a schematic block diagram depicting a sixth illustrative embodiment of the invention.

FIG. 16 shows an embodiment which differs from FIG. 2 in that (1) a first isolation circuit 300 is disposed between comparator 12 and flip flop circuit 13; (2) a second isolation circuit 350 is disposed between the output terminal of the flip flop circuit 13 and the D/A converter 14; and (3) the first and second startup circuits are provided to generate signals for restarting the embodiment in case the embodiment comes to an abnormal stop when the power is turned ON, due to an ingress of noise, or due to other reasons.

The operation of the FIG. 16 embodiment will be described with reference to FIG. 17, wherein the first and second startup circuits 400 and 450 are omitted. The first isolation circuit 300 transfers, in an electrically isolated manner, only the rising edge signal (called an upward going edge signal) and the falling edge signal (called a downward going edge signal) occur when the output signal D12 of comparator 12 changes. The first isolation circuit 300 demodulates the output signal D12 of the comparator according to the isolated, transferred signals.

Figure 18:
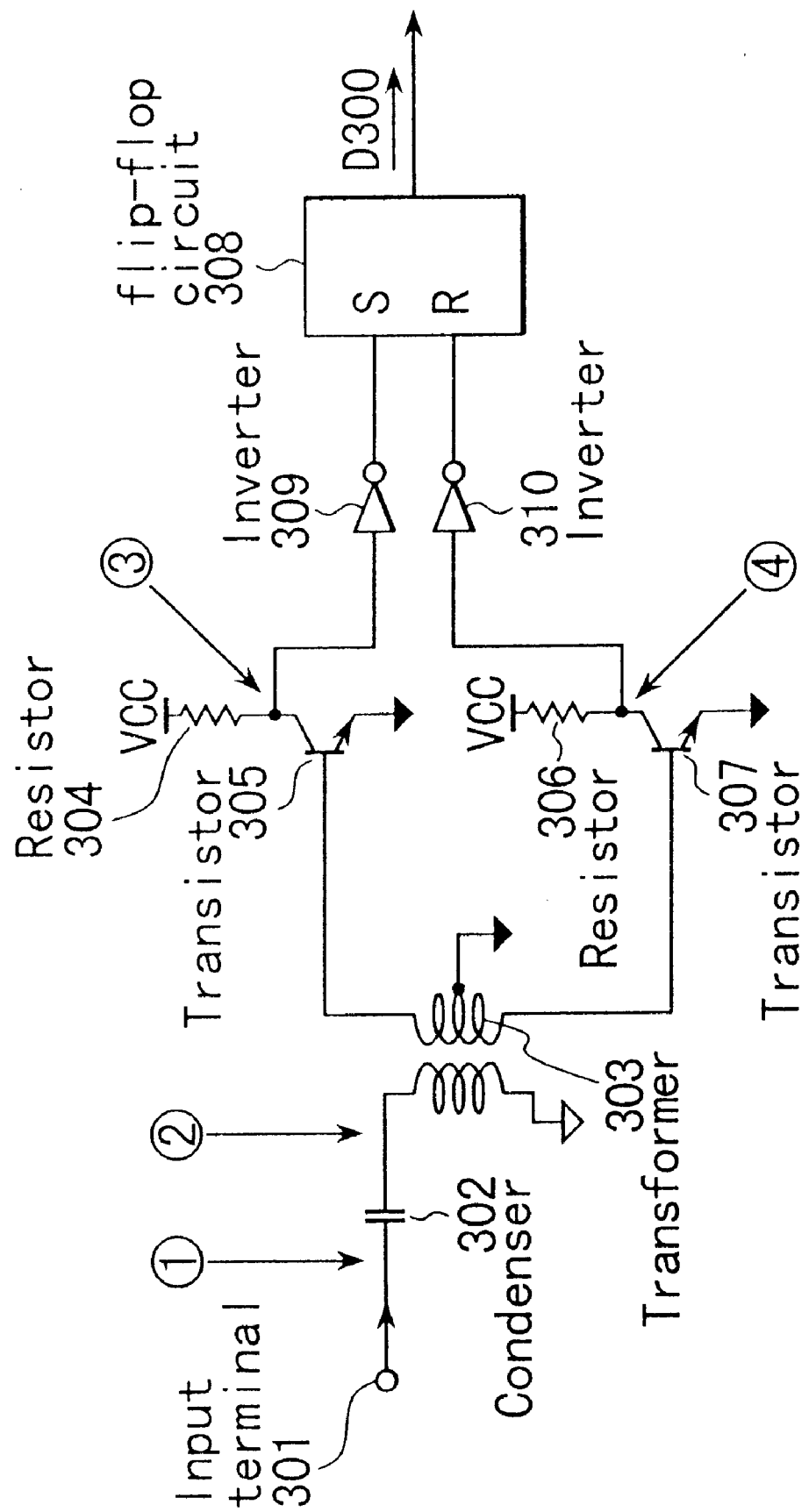
FIG. 18 is a schematic block diagram depicting an example of a first isolation circuit usable in the embodiment of FIG. 16.

FIG. 18 shows details of the first isolation circuit 300, wherein an input terminal 301 is connected to one end of a differentiating capacitor 302, the other end of which is connected to one end of the primary winding of an isolation transformer 303. The other end of the primary winding of the isolation transformer 303 is connected to a primary common potential line. One end of the secondary winding of the isolation transformer 303 is connected to the base of a transistor 305 for detecting the upward going edges. A power supply Vcc is fed through a resistor 304 to the collector of the transistor 305. The emitter of transistor 305 is connected to a secondary common potential line. The other end of the secondary winding of isolation transformer 303 is connected to the base of transistor 307 for detecting the detecting downward going edges. A power supply Vcc is fed through a resistor 306 to the collector of the transistor 307. The emitter of transistor 307 is connected to a secondary common potential line. The center tap of the secondary winding of isolation transformer 303 is connected to a secondary common potential line.

The collector of transistor 305, for detecting upward going edges, is also connected through an inverter 309 to the set terminal S of the SR flip flop circuit 308 so that an inverting input signal is supplied. The collector of the transistor 307, for detecting the downward going eges, is also connected through an inverter 310 to the reset terminal R of the SR flip flop circuit 308 so that an inverting input signal is supplied. The output terminal D300 of the SR flip flop circuit 308 is connected to the input terminal of the flip flop circuit 13 and supplies the output signal of the first isolation circuit 300. The SR flip flop circuit 308 latches the output signal D300 to a high state when a pulse signal is inputted to the set terminal S, and to a low state when a pulse signal is inputted to the reset terminal R.

Figure 19:
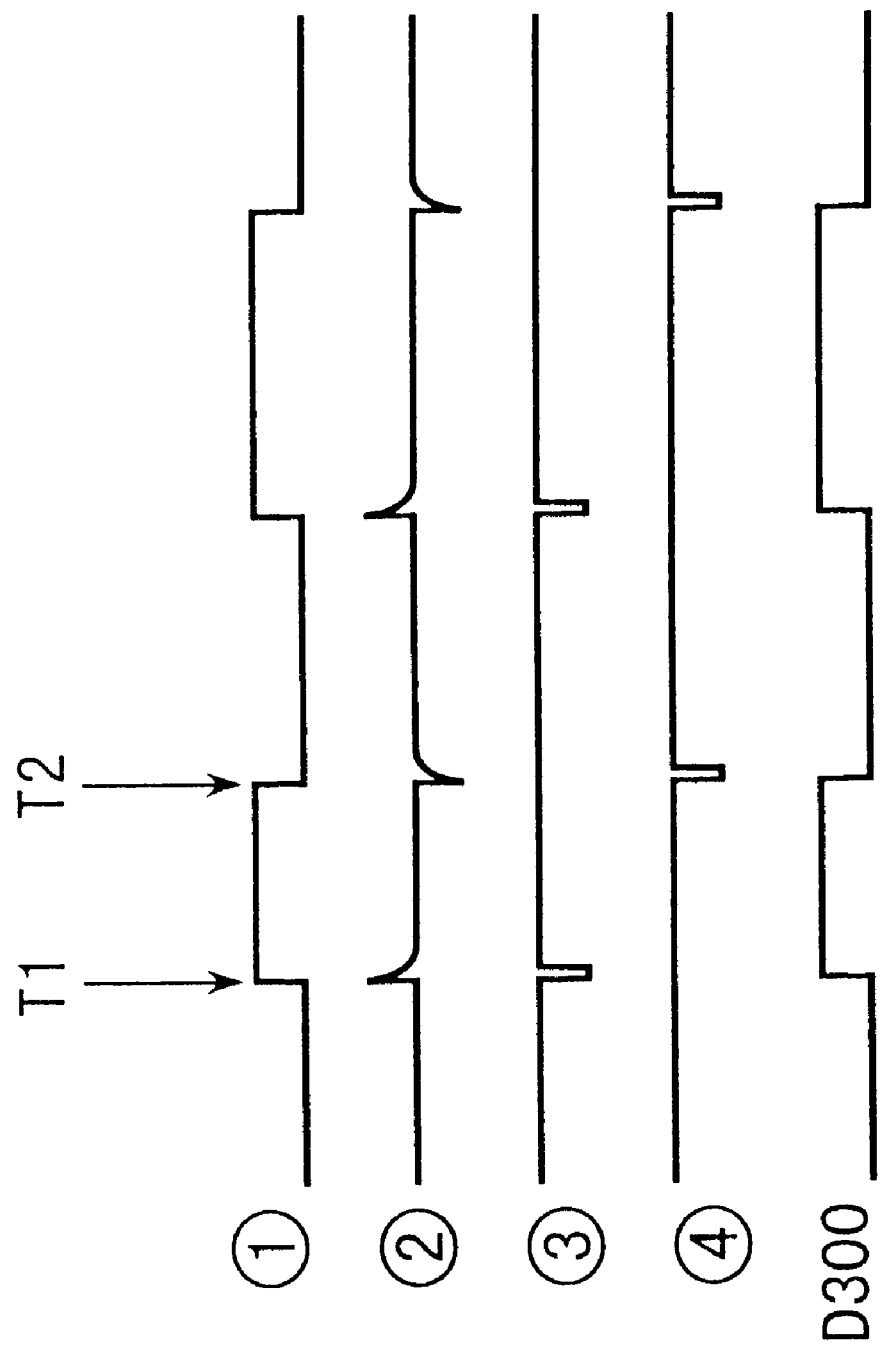
FIG. 19 is a timing chart depicting behavior of a first isolation circuit of the embodiment of FIG. 16.

FIG. 19 shows waveforms at various points of the first isolation circuit 300 shown in FIG. 18, wherein the timing chart shows the relationship between an input signal ① inputted from the comparator 12 to the first isolation circuit 300; a differential signal ② obtained by inputting the input signal ① to the differentiating capacitor 302; a collector voltage ③ of the transistor 305 for detecting the upward going edges; a collector voltage ④ of transistor 307 for detecting downward going edges; and the output signal D300 of the SR flip flop cirucit 308 having an inverted input signal applied thereto.

At time T1, whereat the input signal ① changes from a low state to a high state, an upward going edge signal , such as shown in differential signal ②, is inputted to the primary winding of the isolation transformer 303 by the effect of the differentiating capacitor 302. The isolation transformer 303. transfers an upward going edge signal applied to the primary winding thereof down to the secondary winding thereof in an electrically isolated manner , thereby feeding current induced at the secondary winding to the based of the transistor 305. This causes the collector voltage ③ to develope at the collector of the transistor 305. The collector voltage ③ thus produced is inverted by the inverter 309 and inputted as a set signal to the set terminal S of the SR flip flop circuit 308. The SR flip flop circuit 308 latches the output signal D300 to a high state using the set signal inputted to the set terminal S.

At time T2 whereat the input signal ① changes from a high state to a low state, a downward going edge signal, such as shown in the differential signal ② is inputted to the primary winding of the isolation transformer 303 by the effect of the differentiating capacitor 302. The isolation transformer 303 transfers a downward going edge signal, which is inputted via the primary winding thereof to the secondary winding thereof in an electrically isolated manner, thereby feeding current induced at the secondary winding to the base of transistor 307. This causes the collector voltage ④ to develope at the collector of the transistor 307. The collector voltage ④ thus produced is inverted by the inverter 310 and inputted as a reset signal to the reset terminal R of the SR flip flop circuit 308. The SR flip flop circuit 308 latches the output signal D300 to a low state using the reset signal inputted to the rest terminal R thereof.

By repeating the foregoing operation, the first isolation circuit 300 demodulates the input signal ① inputted to the input terminal 301 to provide the output signal D300 having the same waveform as the input signal ①. Since the first isolation circuit 300 transfers only the differential signal component of the input signal ① in an electrically isolated manner, it is possible to use a smaller isolation transformer 303, compared with conventional methods that transfer the input signal ① as it is in an electrically isolated manner.

Thus, with the invention it is possible to downsize the isolation circuit, as well as to fabricate the circuit at lower cost. In addition, although the first isolation circuit 300 shown in FIG. 18 uses an isolation transformer 303, it is possible to use photocouplers as an isolation mechanism.

Figure 20:
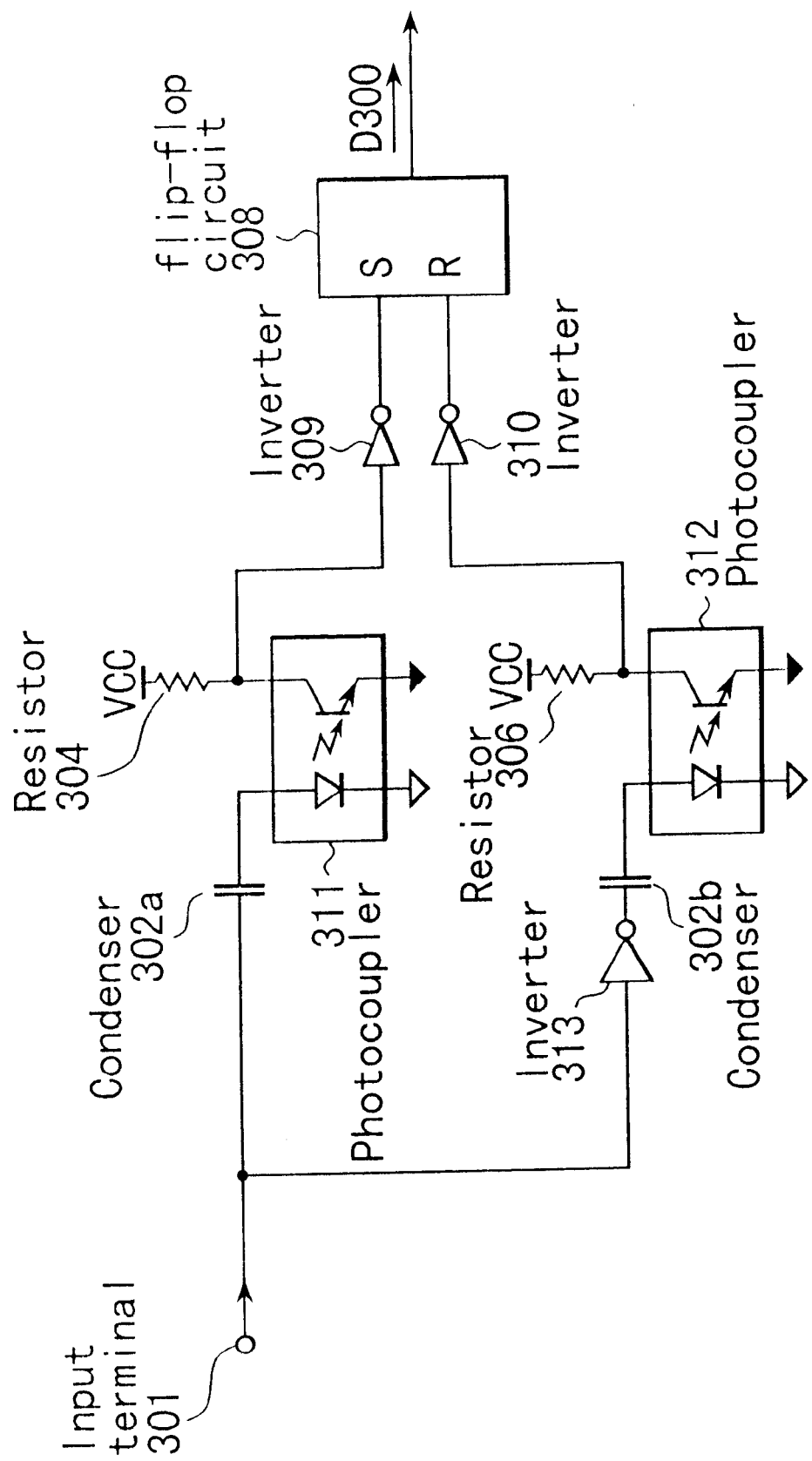
FIG. 20 is a schematic block diagram depicting another example of a first isolation circuit usable in the embodiment of FIG. 16.

FIG. 20 shows an example of an isolation circuit which uses a photocoupler as the isolation mechanism. The components of the photocoupler that function in the same manner as those in the first isolation circuit of FIG. 18 have the same reference symbols and are not discussed hereat for sake of convenience. In FIG. 20, an input terminal 301 is connected to one end of a differentiating capacitor 302a, the other end of which is connected to a light emitting device of the photocoupler 311 for detecting upward going edges. The input terminal 301 is also connected through an inverter 313 to one end of a differentiating capacitor 302b, the other end of which is connected to a light emitting device of photo-coupler 312 for detecting downward going edges. A power supply Vcc is connected through a resistor 304 to a photo-electric detector of the photocoupler 311. The connection point between the resistor 304 and the photocoupler 311 is connected through an inverter 309 to the set terminal S of the SR flip flop circuit 308. A power supply Vcc is connected through a resistor 306 to a photoelectric detector of photo-coupler 312. The connection point between the resistor 306 and the photocoupler 312 is connected through the inverter 310 to the reset terminal R of the SR flip flop circuit 308.

In the isolation circuit of FIG. 20, when the same signal as the input signal ① of FIG. 18 is inputted to the input terminal 301, upward going edges are transferred by the photocoupler 311, in an electrically isolated manner, and downward going edges are transferred by the photocoupler 312 also in an electrically isolated manner. Thus, it is possible to obtain the same signal as the input signal ① as an output signal D300 of the SR flip flop circuit 308.

Since the first isolation circuit 300 described in FIG. 20 transfers only the differential signal component of the input signal ① in an electrically isolated manner using the photocouplers, advantageously, it is possible to reduce current consumption because the time length during which the light emitting device of the photocoupler is turned ON is shortened dramatically, compared with conventional methods that transfer the input signal ① in a manner which would be electrically isolating.

The second isolation circuit 305, for example, shown in FIG. 17, has the same configuration as the first isolation circuit described with reference to FIG. 20. The second isolation circuit 305 uses an SR flip flop circuit with no inverting input and outputs the output signal D350.

Figure 17:
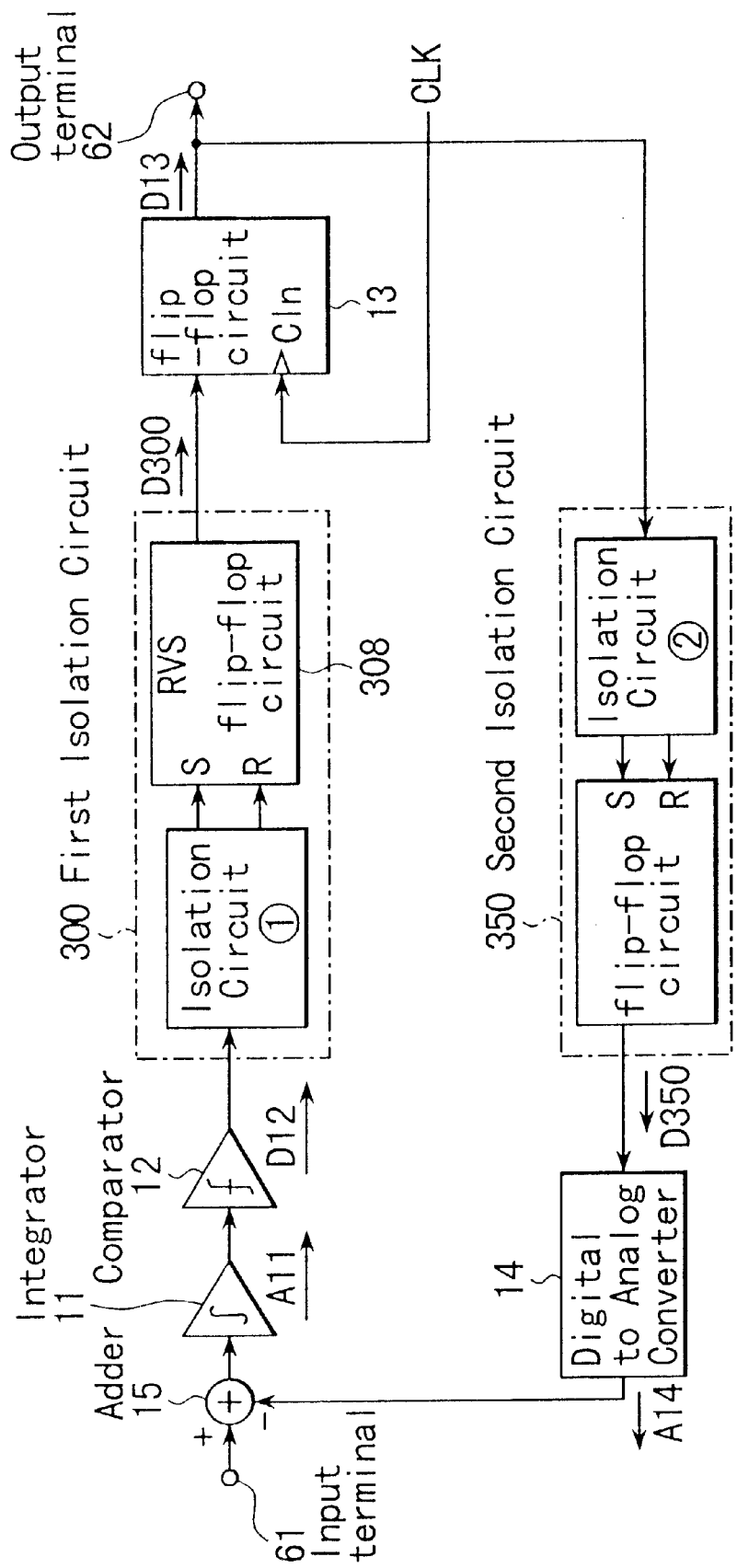
FIG. 17 is a schematic block diagram depicting a seventh illustrative embodiment of the invention which is a variation of the embodiment of FIG. 16.

Thus, the embodiment of FIG. 17 has advantages resulting from the use of an isolation circuit that transfers differential signals across the isolation boundary. If an isolation transformer is used as the isolation mechanism, such as shown in FIG. 18, it is possible to downsize the sigma-delta A/D converter and reduce its costs. On the other hand, if photocouplers are used as the isolation mechanism, such as shown in FIG. 20, it is possible to reduce the current consumption of the sigma-delta A/D converter.

In addition, advantageously, the sigma-delta A/D converter of the invention employs a stabilization mechanism to stabilize operation. In the case of the comparators and flip flop circuits, it is generally impossible to determine whether their outputs become high or low at the moment when they are turned ON. In other words, the output state of the comparator and flip flop circuit is uncertain at the very moment the device is turned ON. The sigma-delta A/D converter shown in FIG. 17 operates in such a manner that the output signal D12 of the comparator 12 and the output signal D350 of the second isolation circuit 350 share the same polarity when they are operated normally.

If the output signal D12 of comparator 12 becomes high and the output signal D350 of the second isolation circuit 350 becomes low at the moment the converter is turned ON, a signal, which is the sum of the inverted output signal D350 of the second isolation circuit 350 and the input signal Ain provided by the adder 15, is inputted to the integrator 11, thereby causing the output signal A11 of the integrator 11 to saturate to the positive side. Hence, the output signal D12 of the comparator 12 remains high and does not change, thereby inhibiting the start of the sigma-delta A/D converter. On the other hand, when the output signal D12 of the comparator 12 become low and the output signal D350 of the second isolation circuit 350 becomes high, at the moment the sigma-delta A/D converter is turned ON, a signal which is the sum of the inverted output signal D350 of the second isolation circuit 350 and the input signal Ain provided by the adder 15, is inputted to the integrator 11, thereby causing the output signal A11 of the integrator 11 to saturate to the negative side. Hence, the output signal D12 of the comparator 12 remains low and does not change, also thereby inhibiting the start of the sigma-delta A/D converter.

When the sigma-delta A/D converter is operated to the foregoing state (called "state of abnormal stop") and the output signal thereof remains unchanged, the A/D converter can be restarted by forcibly inverting the output signal D300 of the first isolation circuit 300. The first and second startup circuits 400 and 450 in FIG. 16 function to provide such operation.

In FIG. 16, the output signal D13 of the flip flop circuit 13 is supplied to the edge detector 451 of the second startup circuit 450, the output signal of which is supplied to the reset terminal CLR of a counter circuit 452. The output signal of the counter circuit 452 is inputted to the inverting terminal RVS of the SR flip flop circuit 308 disposed in the first isolation circuit 300. The edge detector 451 is designed to detect a high to low or low to high transition in the output signal D13 of the flip flop circuit 13 in order to produce a pulse signal. The counter circuit 452 (1) resets the count to zero when the signal inputted to the reset terminal CLR becomes high; (2) starts to count up when the signal becomes low once again; and (3) outputs a pulse signal when the count reaches a predetermined limit. In addition, when the power is turned ON, the counter circuit 452 resets the count to zero and starts to count up. The SR flip flop circuit 308, having an inverting input terminal RVS, inverts the output signal D300 when the signal inputted to the inverting terminal RVS becomes high.

Also, as shown in FIG. 16, the output signal D12 of the comparator 12 and the set signal Sin2 of the second isolation circuit 350 are inputted to the error detector ERR-S disposed in the first startup circuit 400. The output signal D12 of the comparator 12 is also supplied to error detector ERR-R together with a reset signal Rin2 of the second isolation circuit 350. The output signals ESo and ERo of the error detectors ERR-S and ERR-R are added to the output signal D12 of the comparator 12 by an adder 16. The output signal of the adder 16 is inputted to the first isolation cirucit 300. The error detectors ERR-S and ERR-R are designed to detect the mismatches in logical states between the output signal D12 of the comparator 12 and the output signal D350 of the second isolation circuit 350.

The error detector ERR-R is designed to output a positive pulse signal ERo when the reset signal Rin2 is inputted from the second isolatio cirucit 350 with the output signal D12 of the comparator 12 set to a high state. The error detector ERR-S is designed to output a negative pulse ESo when the set signal Sin2 is inputted from the second isolation circuit 350 with the output signal D12 of the comparator 12 set to a low state. FIG. 21 shows this relationship.

The two output signals described above are added to the output signal D12 of comparator 12 by the adder 16 (see FIG. 16), and the resulting sum of the signals is inputted to the first isolation circuit 300. The first and second startup circuits 400 and 450 are described with reference to the timing chart of FIG. 22, which shows the relationship between the input signal A11 and the output signal D12 of comparator 12, the output signal D300 of the first isolation circuit 300, the output signal D13 of the flip flop circuit 13 (which is the signal inputted to the second isolation circuit 350), the output signal D350 of the second isolation circuit 350, the output signal ESo of the error detector ERR-S, the output signal ERo of the error detector ERR-R, the output signal D452 of the counter circuit 452, and the clock signal CLK.

Figure 22:
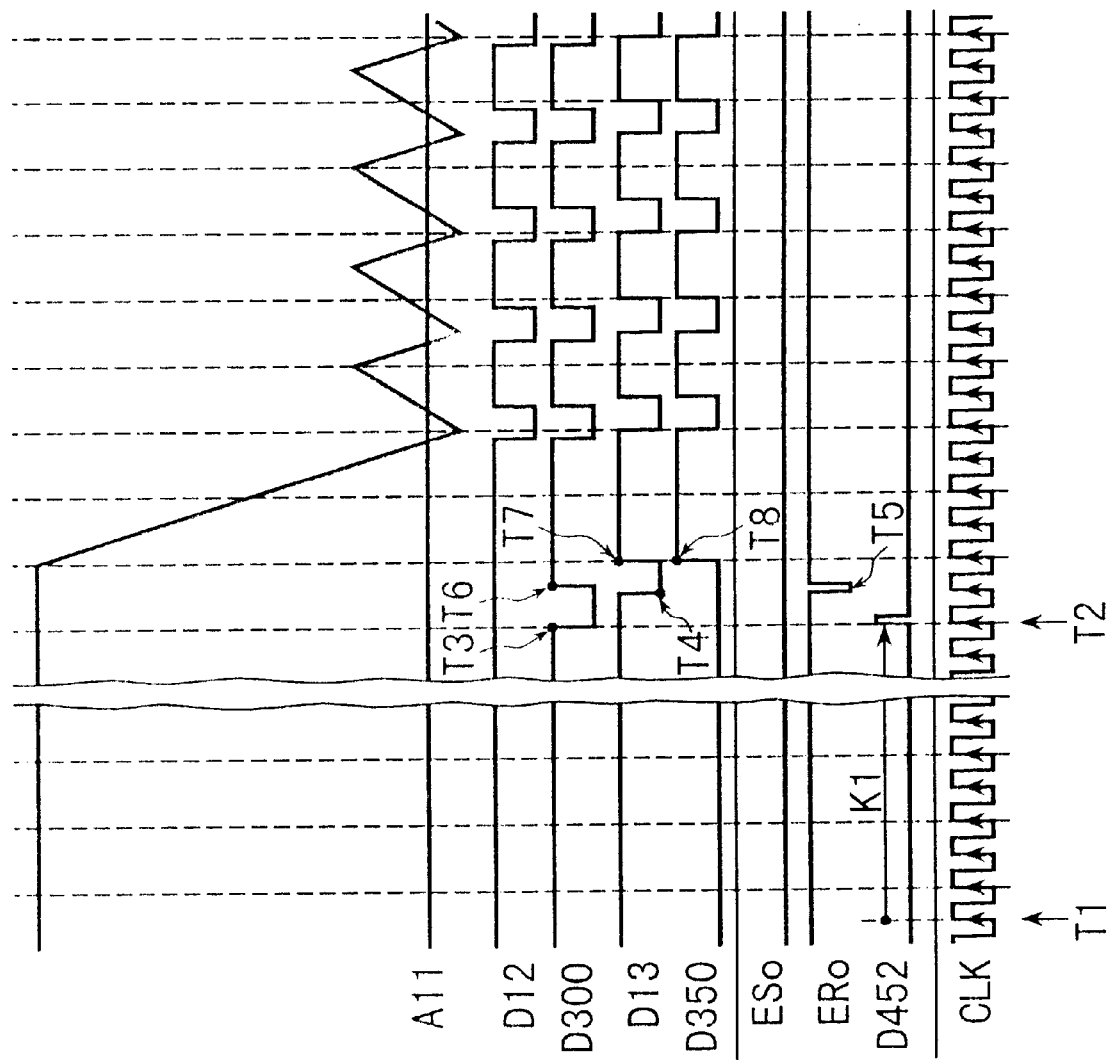
FIG. 22 is a timing chart depicting behavior of the embodiment of FIG. 16.

The timing chart of FIG. 22 shows the case where the output signal D12 of comparator 12 becomes high, the output signal D300 of the first isolation circuit 300 becomes high, and the output signal D350 of the second isolation circuit 350 becomes low the moment the sigma-delta A/D converter is turned ON. In FIG. 22, when the embodimetn shown in FIG. 17 goes into the condition described above, the moment the embodiment is turned ON, operation thereof cannot be started. The first and second startup circuits 400 and 450 causes resumption of normal operation in the following manner. At time T1, when the power is turned ON, the output signal D12 of comparator 12 and the output signal D300 of the first isolation circuit 300 are high, and the output signal D350 of the second isolation circuit 350 is low. At the sane time as time T1, the timer circuit 452 starts to count up. The time interval K1 from when the counter circuit 452 starts to count up to when the time expires is the period during which the embodiment is at an abnormal stop.

When the timing of timer circuit 452 expires, it outputs a pulse signal D452 (as indicated by time T2). The SR flip flop circuit 308, having an interval terminal RVS, inverts the output signal D300 by means of the pulse signal D452 inputted to the inverting terminal RVS (as indicated by time T3). This causes the flip flop circuit 13 to set its output signal D13 to a low state (as indicated by time T4). Hence, the second isolation circuit 350 produces a reset signal Rin2. At this point, the error detector ERR-R compares the reset signal Rin2 with the output signal D12 of the comparator 12 and then judges the reset signal Rin2 to be faulty, thereby producing the output signal ERo (as indicated by time T5).

The output signal ERo is added to the output signal D12 of comparator 12 by the added 16. The resulting signal is inputted to the first isolation circuit 300. Since the output signal ERo, that is a negative pulse, is added to the output signal D12 of the comparator 12 which is high, the signal inputted to the first isolation circuit 300 is low for a period of time as long as the pulse width of the output signal ERo, and then goes back to a high state. The output signal D300 of the first isolation circuit 300 detects the upward going edge of that input signal to latch its output signal D300 to a high state (as indicated by the time T6). The flip flop circuit 13 thereby sets the output signal D13 thereof to be high (as indicated by time T7), and causing the second isolation circuit 350 to also set the output signal D350 thereof to be high (as indicated by time T8). Since this results in agreement of the output signal D12 with output signal D350 the embodiment starts normal operation.

Figure 23:
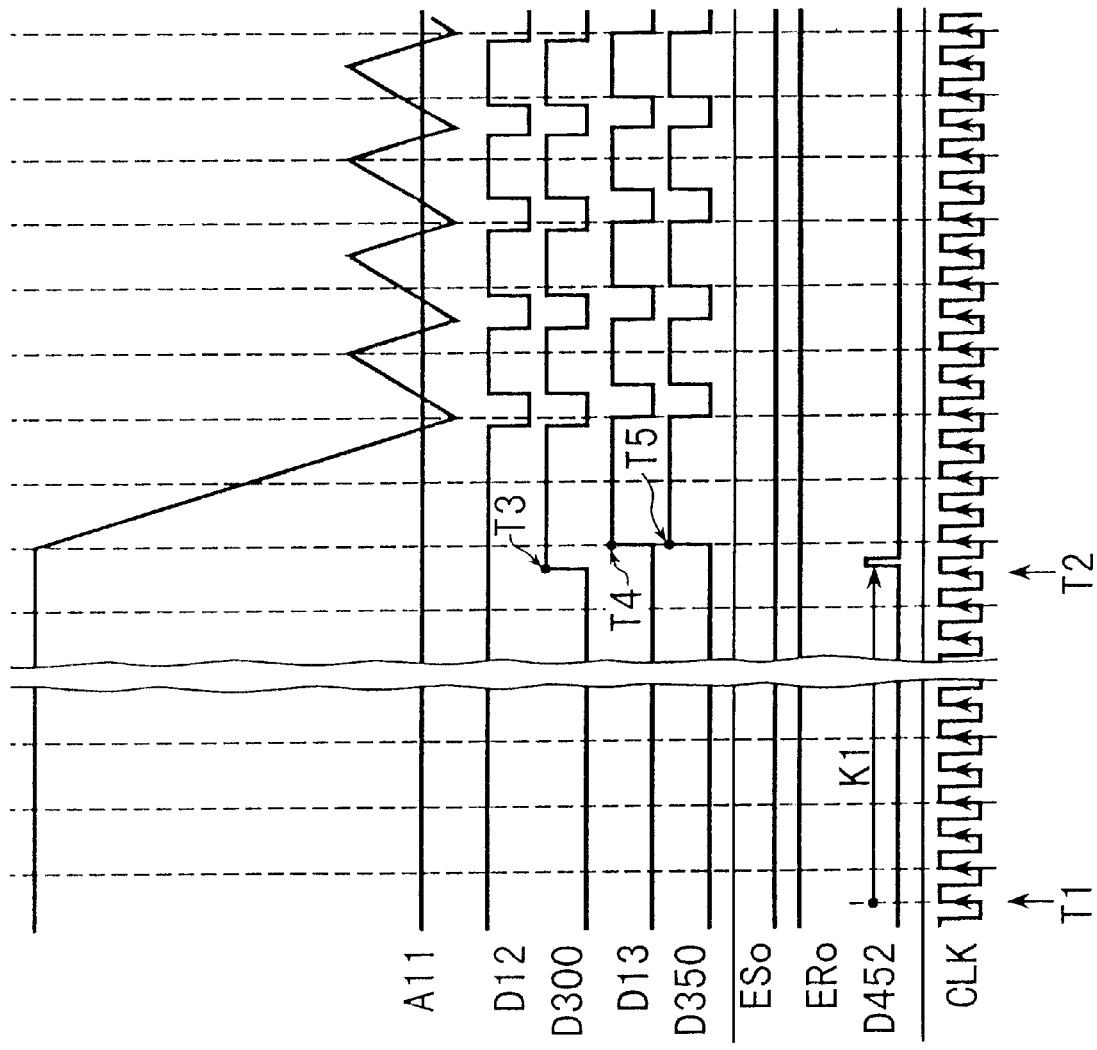
FIG. 23 is another timing chart depicting behavior of the embodiment of FIG. 16.

FIG. 23 shows a timing chart for the case when the output signal D12 of comparator 12 becomes high, the output signal D30 of the first isolation circuit 300 becomes low, and the output signal D350 of the second isolation circuit 350 becomes low at the moment the embodiment of FIG. 16 is turned ON. The embodiment cannot start operation in this case. The first and second startup circuits 400 and 450 resume normal operation in the following manner. At time T1, when the power is turned ON, the output signal D12 of comparator 12 is high, the output signal D300 of first isolation circuit 300 is low, and the output signal D350 of second isolation circuit 350 is low. At the same time, as time T1, the timer circuit 452 starts to count up. The time interval K1 from the time when the counter circuit 452 starts to count up to when the timing expires is the period during which the embodiment is at an abnormal stop. When the timing of the timer circuit 452 expires, the circuit 452 outputs a pulse signal D452(as indicated by time T2).

The SR flip flop circuit 308, having an inverting terminal RVS, inverts the output singal D300 by means of the pulse signal D452 supplied to the inverting terinal RVS (as indicated by time T3). This causes the flip flop circuit 13 to set the output signal D13 thereof to be high (as indicated by time T4) and the second isolation circuit 350 sets the output signal D350 thereof also to be high (as indicated by time T5). Since this results in agreement of the output signal D12 with the output signal D350, the embodiment of FIG. 16 resumes normal operation.

Figure 24:
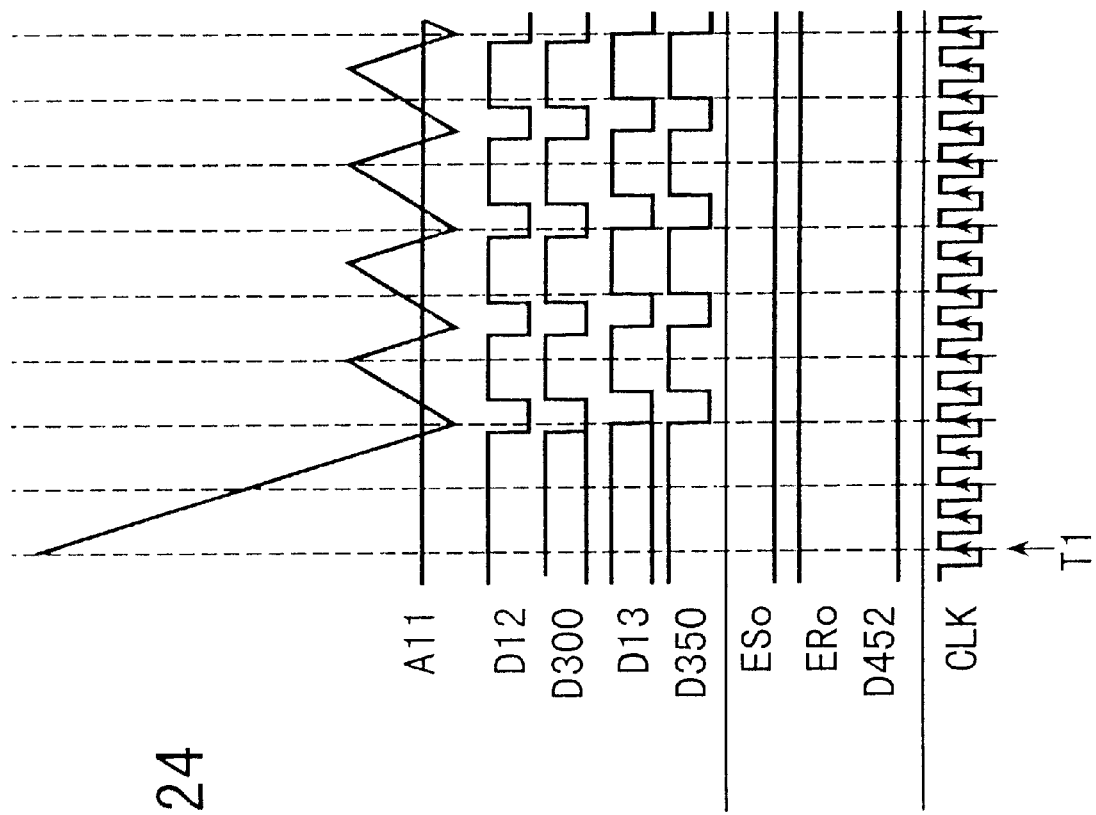
FIG. 24 is yet another timing chart depicting behavior of the embodiment of FIG. 16.

FIG. 24 shows a timing chart for the case when both the output signal D12 of the comparator 12 and the output signal D350 of the second isolation circuit 350 becomes high, at the moment the embodiment is turned ON. Since this results in agreement of the output signal D12 of comparator 12 with the output signal D350 of second isolation circuit 350, the embodiment continues normal operation. At this point, it does not matter whether the output signal D300 of first isolation circuit 300 is low or high.

Figure 25:
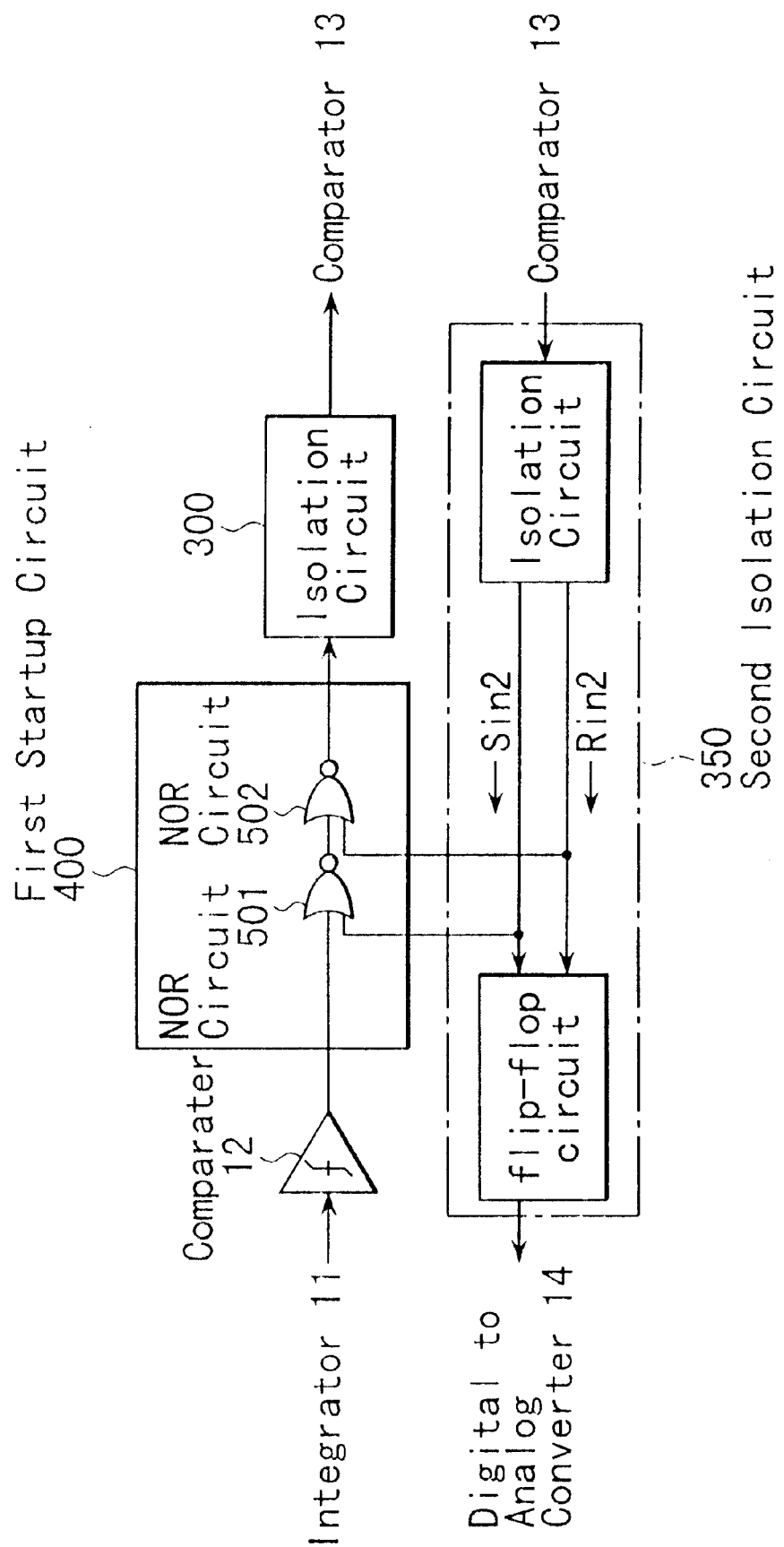
FIG. 25 is a schematic block diagram depicting an example of a first driving or startup circuit usable in the embodiment of FIG. 16.

FIG. 25 shows circuitry comprising an example of a first startup circuit 400 and second isolation circuit 350 such as used in the embodiment of FIG. 16, wherein the first startup circuit 400 comprises a first NOR circuit 501 wherein the output signal D12 of comparator 12 is applied to one input terminal of first NOR circuit 501 and a set signal Sin2 of the second isolation circuit 350 is applied to the other input terminal of the first NOR circuit 501; and a second NOR circuit 502 wherein the output signal of first NOR circuit 501 is applied to one input terminal of second NOR circuit 502 and a reset signal Rin2 of second isolation circuit 350 is applied to the other input terminal of second NOR circuit 502.

The first startup circuit 400 shown in FIG. 16 comprises two error detectors ERR-S and ERR-R and adder 16. However, advantageously, it is possible to achieve the same effect as that of the first startup circuit 400 of FIG. 16 by using the first startup circuit 400 shown in FIG. 25.

The foregoing specific embodiments are set forth as examples of carrying out the invention, and are therefore to be considered as illustrative and not restrictive. The invention may be embodied in still other ways without departing from the spirit and essential characteristics thereof. Accordingly, it should be understood that all modifications and extensions thereof are covered by the appended claims.

Figure 26:
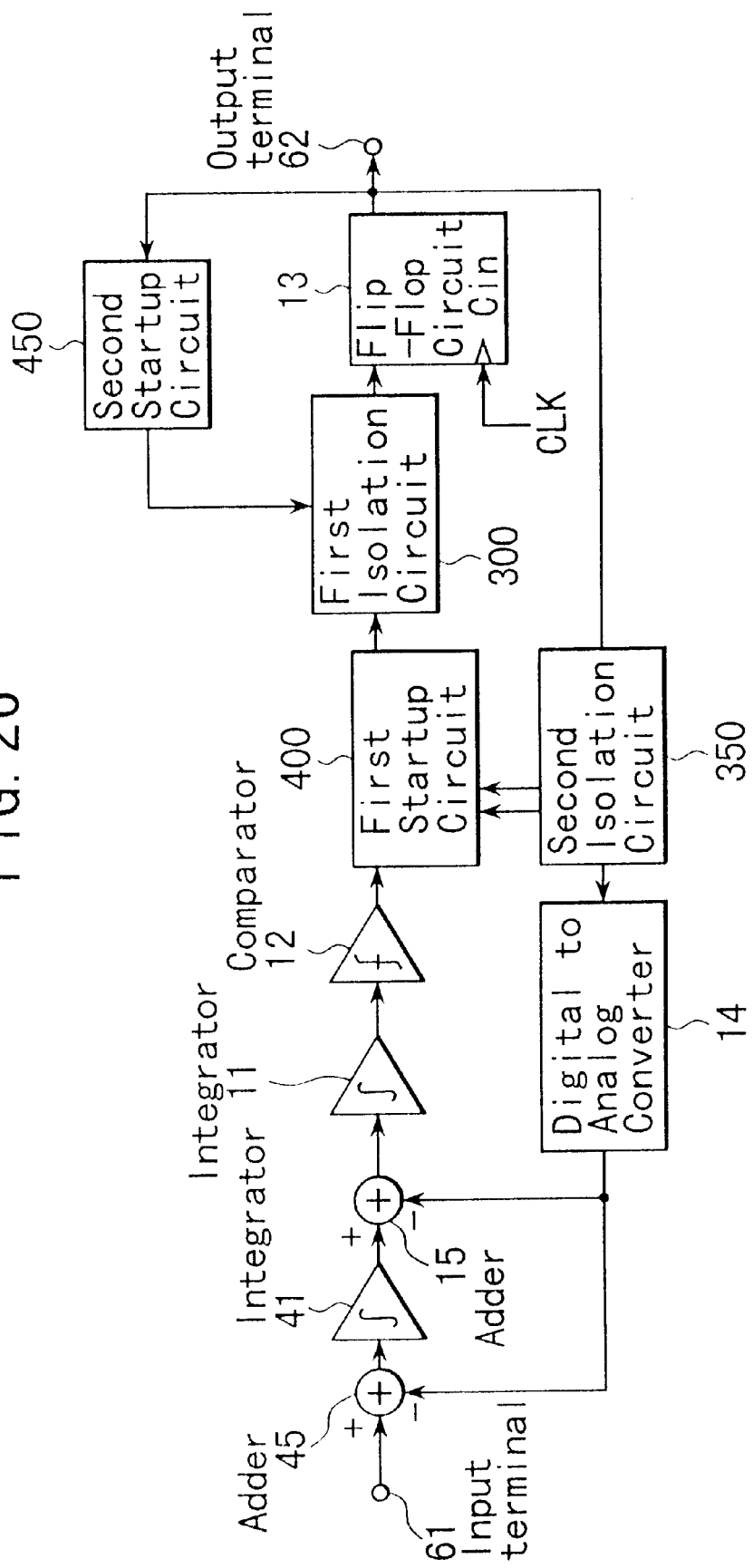
FIG. 26 is a schematic block diagram depicting an eighth illustrative embodiment of the invention which is a variation of the embodiment of FIG. 16.

For example, the isolation means of FIG. 16 is also effective for use in a double integrator embodiment of FIG. 26 where an adder 45 and another integrator 41 are added. It is possible to reduce the quantized noise of a sigma-delta A/D converter and improve resolution thereof as compared with the single integrator type by increasing the number of integrators as shown in FIG. 26. Also, the isolation mechanism shown in FIG. 16 is also effective for sigma-delta A/D converters where a hold circuit 56 is disposed between the output terminal of the flip flop circuit 13 and the D/A converter 14, as shown in FIG. 27. The hold circuit 56 enables the speed of the comparator 12 and integrator 11 to be kept low, as compared with the frequency of the clock signal CLK, which enables the sigma-delta A/D converter to be operated with reduced current, and less cost.

What is claimed is:

1. In a sigma-delta analog-to-digital converter comprising an input terminal; an output terminal; adder means; integrator means; comparator means; digital-to-analog converter means; and a flip flop circuit; wherein an output signal from said flip flop circuit is supplied to said output terminal and fed back to said adder means through said digital-to-analog converter means to provide a pulse density signal corresponding to a given input signal; the improvement comprising means for isolating an output terminal of said comparator means from an input terminal of said flip flop circuit and for isolating an output terminal of said flip flop circuit from an input terminal of said digital-to-analog converter means.

2. The converter of claim 1, wherein said means for isolating comprises a transformer or photocouplers.

3. The converter of claim 1, wherein said integrator means comprises more than one integrator connected in series.

4. The converter of claim 1, wherein said digital-to-analog converter means receives an output signal from said flip flop circuit through a hold circuit.

5. A sigma-delta analog-to-digital converter comprising: an input terminal; adder means; integrator means; comparator means for comparing output of said integrator means with a predetermined setpoint to provide result of comparison as a single bit digital value; a flip flop circuit for holding output of said comparator means in synchronization with a trigger applied to said flip flop circuit; a digital-to-analog converter means; and an output terminal, wherein an output signal from said flip flop circuit is supplied to said output terminal and is fed back to said adder means through said digital-to-analog converter means to output a pulse density signal corresponding to a given input signal; and further comprising a trigger control means for controlling timing of a trigger signal to be applied to said flip flop circuit.

6. The converter of claim 5, wherein said trigger control means comprises means for restricting frequency at which said pulse density signal changes by limiting occurrence of said trigger signal for a predetermined period of time.

7. The converter of claim 5, wherein said trigger control means comprises:

means for driving a first controller for detecting an upward going edge in an output signal of said comparator means to generate a first trigger component signal; and means for driving a second controller for detecting a downward going edge in an output signal of said comparator means to generate a second trigger component signal; and means for providing a logical OR signal from said first and second trigger component signals.

8. The converter of claim 7, wherein said first controller is configured so that when output of said comparator means changes from a low state to a high state within a delay of a predetermined number of clock pulses, said first controller generates said first trigger component signal after a delay of said predetermined number of clock pulses after the occurrence of a previous first trigger component signal; and so that when output of said comparator means changes from said low state to said high state after delay of said predetermined number of clock pulses, said first controller generates said first trigger component signal at a timing of a clock pulse immediately after said change.

9. The converter of claim 7, wherein said second controller is configured so that when output of said comparator means changes from a high state to a low state within a delay of a predetermined number of clock pulses, said second controller generates said second trigger component signal after a delay of said predetermined number of clock pulses after the occurrence of a previous second trigger component signal; and so that when output of said comparator means changes from said high state to said low state after delay of said predetermined number of clock pulses, said second controller generates said second trigger component signal at a timing of a clock pulse immediately after said change.

10. The converter of claim 7, wherein said second controller is configured to comprise an inverter means connected to a circuit having the same configuration as said first controller.

11. The converter of claim 5, wherein said trigger control means is configured to provide a double integrator sigma-delta analog-to-digital converter.

12. In a signma-delta analog-to-digital converter comprising: an input terminal; an output terminal; adder means; integrator means; comparator means; digital-to-analog converter means; and flip flop circuit; wherein an output signal from said flip flop circuit is supplied to said output terminal and fad back to said adder means through said digital-to-analog converter means thereby to provide a pulse density signal corresponding to a given input signal; the improvement comprising:

first isolation means for isolating an output terminal of said comparator means from an input terminal of said flip flop circuit, wherein said first isolation means extracts a differential signal from an output signal of said comparator means, transfers said differential signal in an electricity isolated manner, demodulates said output signal of said comparator means according to said transferred differential signal, and provides the demodulated signal to said flip flop circuit;

second isolation means for isolating an output terminal of said flip flop circuit from an input terminal of said digital-to-analog converter means; wherein said second isolation means extracts a differential signal from an output signal of said flip flop circuit, transfers said differential signal in an electrically isolated manner, demodulates said output signal of said flip flop circuit according to said transferred differential signal, and provides the demodulated signal to said digital-to-analog converter means;

first startup means for generating a pulse signal reverse in polarity to an output signal of said comparator means when said output signal of said comparator means does not agree in polarity with an output signal of said second isolation means, thereby providing a synthesized signal obtained by summing a pulse signal and an output signal of said comparator means to said first isolation means; and second startup means for checking that said output signal of said comparator means does not change for a specific length of time, thereby providing an output inversion command to said first isolation means.

13. The converter of claim 12, wherein said first isolation means comprises:

a differentiating capacitor connected at one end thereof to said input terminal;

an isolation transformer comprising a primary winding connected between another end of said differentiating capacitor and a primary common potential line;

a first transistor for detecting upward going edges and comprising a base, a collector and an emitter, said base being connected to one end of a secondary wending of said isolation transformer, said collector receiving a supply voltage through a first resistor, and said emitter being connected to a secondary common potential line;

a second transistor for detecting downward going edges and comprising a base, a collector and an emitter, said base being connected to another end of said secondary winding of said isolation transformer, said collector receiving a supply voltage through a second resistor, and said emitter being connected to said secondary common potential line; and an SR flip flop circuit comprising a set terminal, a reset terminal and an inverting input terminal for inverting output of said SR flip flop circuit under an externally applied inversion command, a collector voltage of said first transistor being applied to said set terminal though a first inverter, and a collector voltage of said second transistor being applied to said reset terminal through a second inverter.

14. The converter of claim 12, wherein said first isolation means comprises:

first capacitor means for detecting upward going edges and connected at one end thereof to said input terminal;

a first photocoupler for detecting upward going edges and comprising a light emitting device connected between another end of said first capacitor means and a primary common potential line, and a first photoelectric detector connected between a first resistor and a secondary common potential line;

a second capacitor means For detecting downward going edges and connected at one end thereof to said input terminal through an first inverter;

a second photocoupler for detecting downward going edges and comprising a light emitting device connected between another end of said second capacitor means and a primary common potential line, and a second photodetector connected between a second resistor and said secondary common potential line; and an SR flip flop circuit comprising a set terminal, a reset terminal and an inverting input terminal for inverting output of said SR flip flop circuit under an externally applied inversion command, said set terminal connected to a point between said first photodetector and said first resistor, and said reset terminal connected to a point between said second photodetector and said second resistor.

15. The converter of claim 12, wherein said first isolation means comprises:

a differentiating capacitor having one end thereof connected to said input terminal;

an isolation transformer comprising a primary winding connected between another end of said differentiating capacitor and a primary common potential;

a first transistor for detecting upward going edges and comprising a base connected to one end of a secondary winding of said isolation transformer, a collector connected to receive a supply voltage through a first resistor, and an emitter connected to a secondary common potential;

a second transistor for detecting downward going edges and comprising a base connected to another end of said secondary winding of said isolation transformer, a collector connected to receive a supply voltage through a second resistor, and an emitter connected to a secondary common potential; and an SR flip flop circuit comprising a set terminal, and a reset terminal, said set terminal configured to receive a collector voltage of said first transistor through a first inverter, and said reset terminal configured to receive a collector voltage of said second transistor through a second inverter.

16. The converter of claim 12, wherein said second isolation means comprises:

first capacitor means for detecting upward going edges and connected at one end thereof to said input terminal;

first photocoupler means for detecting upward going edges and comprising a light emitting device connected between another end of said first capacitor means and a primary common potential, and a photoelectric detector connected between a first resistor and a secondary common potential;

second capacitor means for detecting downward going edges and connected at one end thereof to said input terminal through a first inverter;

second photocoupler means for detecting downward going edges and comprising a light emitting device connected between another end of said second capacitor means and said primary common potential, and a photoelectric detector connected between a second resistor and said secondary common potential; and an SR flip flop circuit comprisng a set terminal and a rest terminal, said set terminal connected between said photoelectric detector of said first photocoupler means and said first resistor through a first inverter means, and said rest terminal connected between said photoelectric detector of said second photocoupler means and said second resistor through a second inverter means.

17. The converter of claim 12, wherein said first startup means comprises:

a first error detector means connected to an output terminal of said comparator means, and a set terminal of an SR flip flop circuit disposed in said second isolation means;

a second error detecting means connected to an output terminal of said comparator means and a reset terminal of an SR flip flop circuit disposed in said second isolation means; and second adder means for summing output signals of said first and second error detecting means and said comparator means and for providing the summed signals to said first isolation means.

18. The converter of claim 12, wherein said first start up means comprises:

first invert OR means comprising an input terminal connected to an output terminal of said comparator means and another input terminal connected to a set terminal of san SR flip flop circuit disposed in said second isolation means; and second invert OR means comprising an input terminal connected to an output terminal of said first invert OR means and a second input terminal connected to a reset terminal of said SR flip flop circuit of said second isolation means.

19. The converter of claim 12, further comprising an SR flip flop circuit comprising an inverting terminal, a set terminal and a reset terminal; and wherein said second startup means comprises:

an edge detector means for receiving an output signal from said flip flop circuit; and a counter means for inputting an output signal of said edge detector means to said reset terminal of said SR flip flop circuit; and wherein an output terminal of said counter means is connected to said inverting terminal of said SR flip flop circuit.

20. The converter of claim 19, wherein said counter means comprises means for resetting count to zero when a signal inputted to said reset terminal becomes high, means for starting to count up when said signal inputted to said reset terminal goes back to a low state, and means for outputting a pulse signal when count reaches a predetermined limit.

21. The converter of claim 19, wherein said counter means comprises means for resetting count to zero, means for starting to count up at the same time when power is turned ON, and means for providing a pulse signal when count reaches a predetermined limit.

22. The converter of claim 12, wherein said integrator means comprises more than one integrator connected in series.

23. The converter of claim 12, wherein said first or second isolation means comprises means for receiving output of said flip flop circuit through a hold circuit.

* * * * *